United States Patent
Yin et al.

(10) Patent No.: US 11,353,487 B2
(45) Date of Patent: Jun. 7, 2022

(54) METHOD AND APPARATUS FOR DETECTING CAPACITANCE OF FILTER CAPACITOR OF INVERTER

(71) Applicant: Huawei Digital Power Technologies Co., Ltd., Shenzhen (CN)

(72) Inventors: Kai Yin, Shanghai (CN); Zhiwu Xu, Shanghai (CN); Yuandong Meng, Shanghai (CN)

(73) Assignee: HUAWEI DIGITAL POWER TECHNOLOGIES CO., LTD., Shenzhen (CN)

(*) Notice: Subject to any disclaimer, the term of this patent is extended or adjusted under 35 U.S.C. 154(b) by 92 days.

(21) Appl. No.: 16/802,276

(22) Filed: Feb. 26, 2020

(65) Prior Publication Data

US 2020/0191846 A1 Jun. 18, 2020

Related U.S. Application Data

(63) Continuation of application No. PCT/CN2019/076597, filed on Feb. 28, 2019.

(30) Foreign Application Priority Data

Jun. 29, 2018 (CN) .......................... 201810700791.7

(51) Int. Cl.
  *G01R 27/26* (2006.01)
(52) U.S. Cl.
  CPC ................................ *G01R 27/2605* (2013.01)
(58) Field of Classification Search
  None
  See application file for complete search history.

(56) References Cited

U.S. PATENT DOCUMENTS

| 8,090,548 B2 * | 1/2012 | Abdennadher .... G01R 27/2605 |
| | | 702/58 |
| 2007/0278988 A1 * | 12/2007 | De .......................... H02P 27/08 |
| | | 318/801 |

(Continued)

FOREIGN PATENT DOCUMENTS

| CN | 103580497 A | 2/2014 |
| CN | 103795284 A | 5/2014 |

(Continued)

*Primary Examiner* — Arleen M Vazquez
*Assistant Examiner* — Brandon J Becker
(74) *Attorney, Agent, or Firm* — Womble Bond Dickinson (US) LLP

(57) ABSTRACT

A method and an apparatus for detecting capacitance of a filter capacitor of an inverter are provided, wherein each output terminal of the inverter is connected to one terminal of a first filter capacitor through an inductor, and the other terminals of all first filter capacitors are interconnected. The method includes: outputting a first voltage $\dot{U}_{1i}$ through an $i^{th}$ output terminal of the inverter, $i=1, 2 \ldots N$, $i \neq j$, $1 \leq j \leq N$, i and j are positive integers, and N is a total quantity of output terminals of the inverter; obtaining $\dot{I}_{ik}$ and determining a ratio of $|\dot{I}_{ij}|$ to $|\dot{I}_{ik}|$, where $\dot{I}_{ik}$ is a current of an inductor connected to a $k^{th}$ output terminal when the $i^{th}$ output terminal outputs the first voltage $\dot{U}_{1i}$, $k=1, 2 \ldots N$, and k is a positive integer; and determining capacitance of a first filter capacitor connected to the $j^{th}$ output terminal based on $\dot{I}_{ij}$, $\dot{U}_{1i}$, and the ratio of $|\dot{I}_{ij}|$ to $|\dot{I}_{ik}|$.

20 Claims, 5 Drawing Sheets

(56) References Cited

U.S. PATENT DOCUMENTS

| | | | |
|---|---|---|---|
| 2008/0074074 A1* | 3/2008 | Skibinski | H02M 7/003 |
| | | | 318/800 |
| 2014/0032145 A1 | 1/2014 | Yoo | |
| 2014/0119067 A1 | 5/2014 | Choi et al. | |
| 2015/0244284 A1 | 8/2015 | Fu | |
| 2015/0355259 A1 | 12/2015 | Sartler et al. | |
| 2016/0248334 A1* | 8/2016 | Patel | H03H 7/1741 |
| 2016/0254783 A1 | 9/2016 | Unru et al. | |
| 2016/0322916 A1* | 11/2016 | Hao | H02M 7/48 |
| 2017/0149343 A1 | 5/2017 | Bhandarkar et al. | |
| 2018/0100889 A1 | 4/2018 | Swamy et al. | |
| 2019/0273429 A1* | 9/2019 | Li | F16C 19/52 |

FOREIGN PATENT DOCUMENTS

| | | | |
|---|---|---|---|
| CN | 104360186 A | | 2/2015 |
| CN | 105717368 A | | 6/2016 |
| CN | 105874703 A | | 8/2016 |
| CN | 105899963 A | | 8/2016 |
| CN | 106787894 A | | 5/2017 |
| CN | 106932674 A | * | 7/2017 |
| CN | 106932674 A | | 7/2017 |
| CN | 107064750 A | | 8/2017 |
| CN | 109061314 A | | 12/2018 |
| EP | 3242383 A1 | | 11/2017 |
| KR | 20170119506 A | | 10/2017 |
| WO | 2010055556 A1 | | 5/2010 |

\* cited by examiner

METHOD AND APPARATUS FOR DETECTING CAPACITANCE OF FILTER CAPACITOR OF INVERTER

CROSS-REFERENCE TO RELATED APPLICATIONS

This application is a continuation of International Application No. PCT/CN2019/076597, filed on Feb. 28, 2019, which claims priority to Chinese Patent Application No. 201810700791.7, filed on Jun. 29, 2018. The disclosures of the aforementioned applications are hereby incorporated by reference in their entireties.

TECHNICAL FIELD

This application relates to the field of power technologies, and in particular, to a method and an apparatus for detecting capacitance of a filter capacitor of an inverter.

BACKGROUND

To filter out a high frequency component in an alternating-current signal output by an inverter, an output terminal of the inverter is usually connected to an LC filter or an LCL filter. However, affected by operating duration, operating environments (for example, temperature and humidity) and an operating condition, of the inverter, capacitance of a filter capacitor in the filter is attenuated. When the capacitance of the filter capacitor is attenuated to some extent, operating stability of the inverter is affected, resulting in an unpredictable consequence.

Therefore, monitoring capacitance of a filter capacitor of an inverter is of great significance to fault diagnosis, fault prevention, and reliable operation assurance for the inverter.

SUMMARY

This application provides a method and an apparatus for detecting capacitance of a filter capacitor of an inverter, to detect the capacitance of the filter capacitor of the inverter, and monitor an operating status of the inverter, thereby improving operating reliability of the inverter.

According to a first aspect, an embodiment of this application provides a method for detecting capacitance of a filter capacitor of an inverter, where each output terminal of the inverter is connected to one terminal of a first filter capacitor through an inductor, and the other terminals of all first filter capacitors are interconnected. The method includes: outputting, by the inverter, a first voltage $\dot{U}_{1i}$ through an $i^{th}$ output terminal of the inverter, where a voltage output by an output terminal other than the $i^{th}$ output terminal is zero, i=1, 2 ... N, i≠j, 1≤j≤N, i and j are positive integers, and N is a total quantity of output terminals of the inverter; obtaining, by the inverter, $\dot{I}_{ik}$, and determining a ratio of $|\dot{I}_{ij}|$ to $|\dot{I}_{ik}|$, where $\dot{I}_{ik}$ is a current of an inductor connected to a $k^{th}$ output terminal when the $i^{th}$ output terminal outputs the first voltage $\dot{U}_{1i}$, k=1, 2 ... N, and k is a positive integer; $\dot{I}_{ij}$ is a current of an inductor connected to a $j^{th}$ output terminal when the $i^{th}$ output terminal of the inverter outputs the first voltage $\dot{U}_{1i}$, $|\dot{I}_{ij}|$ is a magnitude of $\dot{I}_{ij}$, $|\dot{I}_{ik}|$ is a magnitude of $\dot{I}_{ik}$, and k≠j; and determining, by the inverter based on $\dot{I}_{ij}$, $\dot{U}_{1i}$, and the ratio of to capacitance of a first filter capacitor connected to the $j^{th}$ output terminal.

According to the foregoing method, the inverter controls a voltage output by one output terminal of the inverter to be always zero, controls other output terminals of the inverter to sequentially output a first voltage, and when one output terminal of the inverter outputs the first voltage, controls voltages output by the other output terminals of the inverter to be zero; the inverter obtains a current of the inductor connected to each output terminal of the inverter when one output terminal of the inverter outputs the first voltage and the voltages output by the other output terminals of the inverter are zero; the inverter determines a ratio of a current of an inductor connected to the output terminal with the output voltage being always zero in the inverter to a current of an inductor connected to each of the other output terminals in the inverter; and the inverter determines, based on the first voltage, the determined ratio, and the current of the inductor connected to the output terminal with the output voltage being always zero, capacitance of a first filter capacitor corresponding to the inductor connected to the output terminal with the output voltage being always zero. In other words, the inverter can detect the capacitance of the first filter capacitor of the inverter by controlling a voltage output by the inverter and obtaining the current of the inductor connected to the output terminal of the inverter. In this way, an external device (for example, an excitation source) for detecting the first filter capacitor does not need to be added, thereby reducing detection costs for the filter capacitor of the inverter. Further, an operating status of the inverter can be monitored based on the detected capacitance of the first filter capacitor, thereby improving operating reliability of the inverter.

In an implementation, a magnitude of the first voltage $\dot{U}_{1i}$ output by the inverter and a frequency of the first voltage $\dot{U}_{1i}$ output by the inverter are determined based on accuracy of an inductor current obtained by the inverter and rated capacitance of the first filter capacitor. When the amplitude of the first voltage $\dot{U}_{1i}$ output by the inverter is constant, the inverter can increase detection accuracy of the first filter capacitor by increasing the frequency of the first voltage $\dot{U}_{1i}$.

In an implementation, after determining the capacitance of the first filter capacitor connected to the $j^{th}$ output terminal, the inverter may further determine, based on the capacitance of the first filter capacitor connected to the $j^{th}$ output terminal and the ratio of $|\dot{I}_{ij}|$ to $|\dot{I}_{ik}|$, capacitance of a first filter capacitor connected to an output terminal other than the $j^{th}$ output terminal.

In an implementation, the capacitance of the first filter capacitor connected to the output terminal other than the $j^{th}$ output terminal meets the following formula:

$$C_1 = \frac{C_{1j}}{l},$$

where $C_1$ is capacitance of any first filter capacitor connected to the output terminal other than the $j^{th}$ output terminal, $C_{ij}$ is the capacitance of the first filter capacitor connected to the $j^{th}$ output terminal, and is a ratio of $|\dot{I}_{ij}|$ to a current amplitude of an inductor connected to the any first filter capacitor.

In an implementation, when N=3, that is, when the inverter is a three-phase inverter, the capacitance of the first filter capacitor connected to the $j^{th}$ output terminal meets the following formula:

$$C_{1j} = \frac{|\dot{I}_{ij}|(l_1 + l_2 + l_1 l_2)}{|\dot{U}_{1i}|l_1} \cdot \frac{1}{2\pi f_1},$$

where $C_{ij}$ is the capacitance of the first filter capacitor connected to the $j^{th}$ output terminal, $l_1$ is a ratio of $|\dot{I}_{ij}|$ to $|\dot{I}_{i(6-i-j)}|$, $\dot{I}_{i(6-i-j)}$ is a current of an inductor connected to a $(6-i-j)^{th}$ output terminal when the $i^{th}$ output terminal of the inverter outputs the first voltage $\dot{U}_{1i}$, $|\dot{I}_{i(6-i-j)}|$ a magnitude of $\dot{I}_{i(6-i-j)}$, $l_2$ is a ratio of $|\dot{I}_{(6-i-j)j}|$ to $|\dot{I}_{(6-i-j)i}|$, $\dot{I}_{(6-i-j)i}$ is a current of the inductor connected to the $j^{th}$ output terminal when the $(6-i-j)^{th}$ output terminal of the inverter outputs the first voltage $\dot{U}_{1(6-i-j)}$, $\dot{I}_{(6-i-j)i}$ is a current of an inductor connected to the $i^{th}$ output terminal when the $(6-i-j)^{th}$ output terminal of the inverter outputs the first voltage $\dot{U}_{1(6-i-j)}$, $|\dot{U}_{1i}|$ is a magnitude of the first voltage $\dot{U}_{1i}$, and $f_1$ is a frequency of the first voltage $\dot{U}_{1i}$.

In an implementation, each output terminal of the inverter is connected to one terminal of a second filter capacitor through an inductor, and the other terminals of all second filter capacitors are all connected to a midpoint of a direct current bus of the inverter. In this case, the inverter may detect capacitance of each second filter capacitor by performing the following operations: outputting, by the inverter, a second voltage through each output terminal, where amplitudes, frequencies, and phases of the second voltages output by the output terminals are the same; obtaining, by the inverter, a current of the inductor connected to each output terminal; determining, based on the current of the inductor connected to each output terminal, a current of the second filter capacitor connected to each output terminal; and determining, by the inverter based on the second voltage output by each output terminal and the current of the second filter capacitor connected to each output terminal, capacitance of the second filter capacitor connected to each output terminal.

According to the foregoing method, the inverter can detect the capacitance of the second filter capacitor of the inverter by controlling common-mode voltages (voltages with the same magnitude, phase, and frequency) output by the inverter and obtaining the current of the inductor connected to the output terminal of the inverter. In this way, an external device (for example, an excitation source) for detecting the second filter capacitor does not need to be added, thereby reducing detection costs for the filter capacitor of the inverter.

In an implementation, a magnitude of the second voltage output by the inverter and a frequency of the second voltage output by the inverter are determined based on accuracy of an inductor current obtained by the inverter and rated capacitance of the second filter capacitor. When the amplitude of the second voltage output by the inverter is constant, the inverter can increase detection accuracy of the second filter capacitor by increasing the frequency of the second voltage.

In an implementation, the determined capacitance of the second filter capacitor connected to each output terminal meets the following formula:

$$C_{2n} = \frac{|\dot{I}_{C_{2n}}|}{2\pi f_2 |\dot{U}_2|},$$

where $C_{2n}$ is capacitance of a second filter capacitor connected to an $n^{th}$ output terminal of the inverter, is a magnitude of a current $\dot{I}_{C_{2n}}$ of the second filter capacitor connected to the $n^{th}$ output terminal, $f_2$ is a frequency of a second voltage $\dot{U}_2$ output by the $n^{th}$ output terminal, $|\dot{U}_2|$ is a magnitude of the second voltage $\dot{U}_2$, and $1 \le n \le N$, where n is a positive integer.

According to a second aspect, an embodiment of this application further provides a method for detecting capacitance of a filter capacitor of an inverter, where each output terminal of the inverter is connected to one terminal of a filter capacitor through an inductor, and the other terminals of all filter capacitors are all connected to a midpoint of a direct current bus of the inverter. The method includes: outputting, by the inverter, a detection voltage through each output terminal, where amplitudes, frequencies, and phases of the detection voltages output by the output terminals are the same; obtaining, by the inverter, a current of the inductor connected to each output terminal; determining, based on the current of the inductor connected to each output terminal, a current of the filter capacitor connected to each output terminal; and determining, by the inverter based on the detection voltage output by each output terminal and the current of the filter capacitor connected to each output terminal, capacitance of the filter capacitor connected to each output terminal.

According to the foregoing method, the inverter obtains, by controlling the output terminals of the inverter to output third voltages with the same magnitude, phase, and frequency (namely, common-mode voltages), the current of the inductor connected to each output terminal; determines, based on the obtained inductor current, a current of a third filter capacitor connected to each output terminal; and determines, based on the third voltage output by each output terminal and the current of the third filter capacitor connected to each output terminal, capacitance of the third filter capacitor connected to each output terminal. In other words, the inverter can detect the capacitance of the third filter capacitor of the inverter by controlling a voltage output by the inverter and obtaining the current of the inductor connected to the output terminal of the inverter. In this way, an external device (for example, an excitation source) for detecting the third filter capacitor does not need to be added, thereby reducing detection costs for the filter capacitor of the inverter. Further, an operating status of the inverter can be monitored based on the detected capacitance of the third filter capacitor, thereby improving operating reliability of the inverter.

In an implementation, a magnitude of the detection voltage output by the inverter and a frequency of the detection voltage output by the inverter are determined based on accuracy of an inductor current obtained by the inverter and rated capacitance of the filter capacitor. When the amplitude of the detection voltage output by the inverter is constant, the inverter can increase detection accuracy of the filter capacitor by increasing the frequency of the detection voltage.

In an implementation, the determined capacitance of the filter capacitor connected to each output terminal meets the following formula:

$$C_{3n} = \frac{|\dot{I}_{C_{3n}}|}{2\pi f_3 |\dot{U}_{3n}|},$$

where $C_{3n}$ is capacitance of a filter capacitor connected to an $n^{th}$ output terminal of the inverter, $|\dot{I}_{C_{3n}}|$ is a magnitude of a current of the filter capacitor connected to the $n^{th}$ output terminal, $f^3$ is a frequency of a detection voltage output by the $n^{th}$ output terminal, $|\dot{U}_{3n}|$ is a magnitude of the detection voltage, and $1 \le n \le N$, where n is a positive integer.

According to a third aspect, an embodiment of this application provides an apparatus for detecting capacitance of a filter capacitor of an inverter. The apparatus has a function of implementing actions of the inverter in the method embodiment of the foregoing first aspect. The function may be implemented by hardware, or may be implemented by executing corresponding software by hardware. The hardware or software includes one or more modules corresponding to the foregoing function.

In an implementation, a structure of the apparatus includes an output unit, an obtaining unit, and a determining unit, and these units may perform the corresponding function in the method embodiment of the foregoing first aspect. Refer to the detailed descriptions in the method embodiment. Details are not described herein again.

In an implementation, a structure of the apparatus includes a memory, a processor, and a signal generator. The processor is configured to support the apparatus in performing the corresponding function of the method provided in the foregoing first aspect. The memory is coupled to the processor and stores a program instruction and data that are necessary for the apparatus.

According to a fourth aspect, an embodiment of this application provides an apparatus for detecting capacitance of a filter capacitor of an inverter. The apparatus has a function of implementing actions of the inverter in the method embodiment of the foregoing second aspect. The function may be implemented by hardware, or may be implemented by executing corresponding software by hardware. The hardware or software includes one or more modules corresponding to the foregoing function.

In an implementation, a structure of the apparatus includes an output unit, an obtaining unit, and a determining unit, and these units may perform the corresponding function in the method embodiment of the foregoing second aspect. Refer to the detailed descriptions in the method embodiment. Details are not described herein again.

In an implementation, a structure of the apparatus includes a memory, a processor, and a signal generator. The processor is configured to support the apparatus in performing the corresponding function of the method provided in the foregoing second aspect. The memory is coupled to the processor and stores a program instruction and data that are necessary for the apparatus.

According to a fifth aspect, this application further provides a computer storage medium, where the computer storage medium stores a computer executable instruction; and when the computer executable instruction is invoked by a computer, the computer is enabled to perform the method according to the implementations of the first aspect or the second aspect.

According to a sixth aspect, this application further provides a computer program product including an instruction, where when the instruction is run on a computer, the computer is enabled to perform the method according to the implementations of the first aspect or the second aspect.

According to a seventh aspect, this application further provides a chip, where the chip is connected to a memory, and is configured to read and execute a program instruction stored in the memory, to implement the method according to the implementations of the first aspect or the second aspect.

DESCRIPTION OF EMBODIMENTS

An inverter (also referred to as a converter) is a device that can convert a direct current (DC) into an alternating current (AC), and mainly includes two parts: an inverter bridge and a logical control module. The logical control module (for example, a pulse width modulation (PWM) controller converts an input direct current into an alternating current by controlling an on/off state of a switching transistor (for example, an insulated gate bipolar transistor (IGBT) or a metal-oxide semiconductor field effect transistor (MOSFET) in the inverter bridge. Currently, inverters and inverter circuit topologies have been widely used in photovoltaic power grids and devices such as air conditioners and televisions.

To improve quality of an alternating-current signal output by the inverter, the alternating-current signal output by the inverter needs to be filtered by a filter to filter out a high frequency component in the alternating-current signal output by the inverter. However, affected by operating duration, operating environments (for example, temperature and humidity), an operating condition, and other factors of the inverter, capacitance of a filter capacitor in the filter is attenuated. When the capacitance of the filter capacitor is attenuated to some extent, operating stability of the inverter is affected, resulting in an unpredictable consequence.

This application provides a method and an apparatus for measuring capacitance of a filter capacitor of an inverter, to monitor an operating status of the inverter and improve operating reliability of the inverter. The method and the apparatus are based on a same inventive concept. Because principles of the method and the apparatus for resolving a problem are similar, mutual reference may be made between implementations of the apparatus and the method, and repeated descriptions are omitted.

It should be noted that, in the descriptions of the embodiments of this application, the terms "first", "second" and the like are only used for a purpose of description, and cannot be understood as indicating or implying relative importance or a sequence.

The method for detecting capacitance of a filter capacitor of an inverter provided by the embodiments of this application may be applied to a scenario for detecting capacitance of a filter capacitor of a single inverter (for example, a photovoltaic inverter), or may be applied to a scenario for detecting capacitance of a filter capacitor of an inverter in a circuit topology including the inverter. The circuit topology including the inverter may include but is not limited to any one of the following: a frequency converter, a three-phase half-bridge converter circuit, a three-phase full-bridge converter circuit, a multilevel converter circuit.

Figure 1:
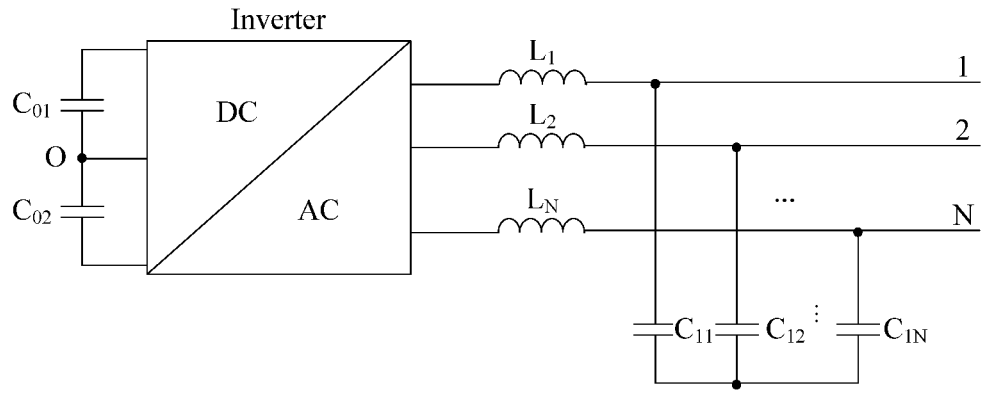
FIG. 1 is a schematic diagram of a connection relationship between an inverter and a first filter capacitor according to an embodiment of this application.

An embodiment of this application provides a method for detecting capacitance of a filter capacitor of an inverter. A connection manner between the inverter and the filter capacitor of the inverter is shown in FIG. 1. Each output terminal of the inverter is connected to one terminal of a first filter capacitor through an inductor, and the other terminals of all first filter capacitors are interconnected. When the inverter has N output terminals for outputting alternating currents, a first output terminal of the inverter is connected to one terminal of a first capacitor $C_{11}$ through an inductor $L_1$, a second output terminal of the inverter is connected to one terminal of a first capacitor $C_{12}$ through the inductor $L_2$, ..., and an $N^{th}$ output terminal of the inverter is connected to one terminal of a first capacitor $C_{1N}$ through an inductor $L_N$; and the other terminals of the first capacitor $C_{11}$, the first capacitor $C_{12}$, ..., and the first capacitor $C_{1N}$ are interconnected. The output terminals of the inverter can output alternating currents of different phases. For example, for a most commonly used three-phase alternating current, a phase difference between alternating currents output by every two output terminals of the inverter is 120°.

Optionally, two bus capacitors $C_{01}$ and $C_{02}$ may be further connected at a midpoint O of a direct current bus of the inverter to stabilize a direct current voltage input to the inverter.

Figure 2:
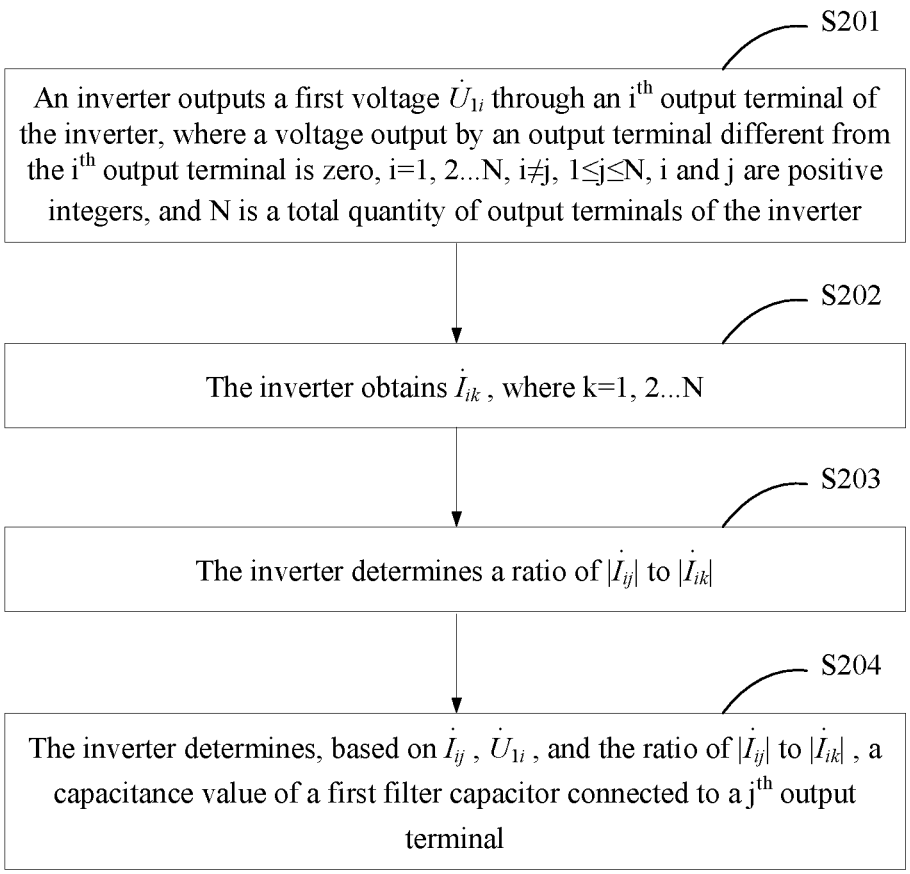
FIG. 2 is a schematic flowchart of a method for detecting capacitance of a filter capacitor of an inverter according to an embodiment of this application.

As shown in FIG. 2, based on the connection manner between the inverter and the filter capacitor shown in FIG. 1, the method for detecting capacitance of a filter capacitor of the inverter provided by this embodiment of this application mainly includes the following operations.

S201: The inverter outputs a first voltage $\dot{U}_{1i}$ through an $i^{th}$ output terminal of the inverter, where a voltage output by an output terminal other than the $i^{th}$ output terminal is zero, i=1, 2 ... N, i≈j, 1≤j≤N, i and j are positive integers, and N is a total quantity of output terminals of the inverter.

Amplitudes, phases, and frequencies of first voltages output by different output terminals of the inverter may be the same, or may be different.

It should be noted that the $i^{th}$ output terminal of the inverter in the embodiments of this application is only used to distinguish different output terminals of the inverter, and cannot be understood as indicating or implying a sequence.

S202: The inverter obtains $\dot{I}_{ik}$, where $\dot{I}_{ik}$ is a current of an inductor connected to a $k^{th}$ output terminal when the $i^{th}$ output terminal outputs the first voltage, k=1, 2 ... N, and k is a positive integer.

In an implementation, the inverter is connected to a sensor (for example, a Hall sensor, a current divider or a current transformer) for measuring a current on an inductor connected to each output terminal of the inverter. In operation S202, the inverter can obtain $\dot{I}_{ik}$ through the sensor. Using the first output terminal of the inverter in FIG. 1 as an example, a current divider is mounted on the inductor $L_1$, the current divider is connected to the inverter, and the inverter obtains a current of the inductor $L_1$ through the current divider.

S203: The inverter determines a ratio of $|\dot{I}_{ij}|$ to $|\dot{I}_{ik}|$ where $\dot{I}_{ij}$ is a current of an inductor connected to a $j^{th}$ output terminal when the $i^{th}$ output terminal of the inverter outputs the first voltage, $|\dot{I}_{ij}|$ is a magnitude of $\dot{I}_{ij}$, $|\dot{I}_{ik}|$, is a magnitude of $\dot{I}_{ik}$, and k≈j.

S204: The inverter determines, based on $\dot{I}_{ij}$, $\dot{U}_{1i}$ and the ratio of $|\dot{I}_{ij}|$ to $|\dot{I}_{ik}|$, capacitance of a first filter capacitor connected to the $j^{th}$ output terminal.

When the $i^{th}$ output terminal of the inverter outputs the first voltage $\dot{U}_{1i}$ and the voltage output by the output terminal other than the $i^{th}$ output terminal is zero, the ratio of $|\dot{I}_{ij}|$ to $|\dot{I}_{ik}|$ is equal to a reciprocal of a ratio of an impedance of the first filter capacitor connected to the inductor of the $j^{th}$ output terminal to an impedance of a first filter capacitor connected to the inductor of the $k^{th}$ output terminal, that is, $$\frac{|\dot{I}_{ij}|}{|\dot{I}_{ik}|} = \frac{Z_{C_{1k}}}{Z_{C_{1j}}},$$

where $Z_{C_{1k}}$ is an impedance of a first filter capacitor $C_{1k}$ connected to the inductor of the $k^{th}$ output terminal, and $Z_{C_{1j}}$ is an impedance of a first filter capacitor $C_{1j}$ connected to the inductor of the $j^{th}$ output terminal. Therefore, the inverter can determine, based on $\dot{I}_{ij}$, $\dot{U}_{1i}$, the ratio of $|\dot{I}_{ij}|$ to $|\dot{I}_{ik}|$, and a connection relationship between each first filter capacitor and the inverter, the capacitance of the first filter capacitor connected to the $j^{th}$ output terminal.

In an implementation, capacitance of a capacitor C is determined by a magnitude of a current $\dot{I}_C$ flowing through the capacitor, a magnitude of a voltage $\dot{U}_C$ of two terminals of the capacitor, and a frequency of $\dot{U}_C$ (or $\dot{I}_C$). Therefore, a magnitude and a frequency of the first voltage output by the inverter and accuracy of an obtained inductor current all affect measurement accuracy of the first filter capacitor. Therefore, a magnitude of the first voltage $\dot{U}_{1i}$ output by the inverter and a frequency of the first voltage $\dot{U}_{1i}$ output by the inverter can be determined based on the accuracy of the inductor current obtained by the inverter and rated capacitance of the first filter capacitor.

When the amplitude of the first voltage $\dot{U}_{1i}$ output by the inverter is constant, a higher frequency of the first voltage $\dot{U}_{1i}$ output by the inverter indicates a larger inductor current $|\dot{I}_{ik}|$ obtained by the inverter. Therefore, when the amplitude of the first voltage $\dot{U}_{1i}$ output by the inverter is constant, the inverter can increase detection accuracy of the first filter capacitor by increasing the frequency of the first voltage $\dot{U}_{1i}$.

In an implementation, after determining the capacitance of the first filter capacitor connected to the $j^{th}$ output terminal in operation S204, the inverter may determine, based on the capacitance of the first filter capacitor connected to the $j^{th}$ output terminal and the ratio of $|\dot{I}_{ij}|$ to $|\dot{I}_{ik}|$, capacitance of a first filter capacitor connected to an output terminal other than the $j^{th}$ output terminal.

The capacitance of the first filter capacitor connected to the output terminal other than the $j^{th}$ output terminal meets the following formula:

$$C_1 = \frac{C_{1j}}{l},$$

where $C_1$ is capacitance of any first filter capacitor connected to the output terminal other than the $j^{th}$ output terminal, $C_{1j}$ is the capacitance of the first filter capacitor connected to the $j^{th}$ output terminal, and is a ratio of to a current amplitude of an inductor connected to the any first filter capacitor.

In an implementation, when N=3, that is, when the inverter is a three-phase inverter, the capacitance of the first filter capacitor connected to the $j^{th}$ output terminal meets the following formula:

$$C_{1j} = \frac{|\dot{I}_{ij}|(l_1 + l_2 + l_1 l_2)}{|\dot{U}_{1i}|l_1} \cdot \frac{1}{2\pi f_1},$$

where $C_{1j}$ is the capacitance of the first filter capacitor connected to the $j^{th}$ output terminal, $l_1$ is a ratio of $|\dot{I}_{ij}|$ to $|\dot{I}_{i(6-i-j)}|$, $\dot{I}_{i(6-i-j)}$ is a current of an inductor connected to a $(6-i-j)^{th}$ output terminal when the $i^{th}$ output terminal of the inverter outputs the first voltage $U_{1i}$, $|\dot{I}_{i(6-i-j)}|$ is a magnitude of $\dot{I}_{i(6-i-j)}$, $l_2$ is a ratio of $|\dot{I}_{(6-i-j)j}|$ to $|\dot{I}_{(6-i-j)i}|$, $\dot{I}_{(6-i-j)j}$ is a current of the inductor connected to the $j^{th}$ output terminal when the $(6-i-j)^{th}$ output terminal of the inverter outputs a first voltage $\dot{U}_{1(6-i-j)}$, $\dot{I}_{(6-i-j)i}$ is a current of an inductor connected to the $i^{th}$ output terminal when the $(6-i-j)^{th}$ output terminal of the inverter outputs the first voltage $\dot{U}_{1(6-i-j)}$, $|\dot{U}_{1i}|$ is a magnitude of the first voltage $\dot{U}_{1i}$, and $f_1$ is a frequency of the first voltage $\dot{U}_{1i}$.

For example, the inverter has three output terminals for outputting alternating currents, that is, the inverter is a three-phase inverter. The following describes in detail a principle for detecting capacitance of a filter capacitor of the inverter provided by this embodiment of this application.

Figure 3:
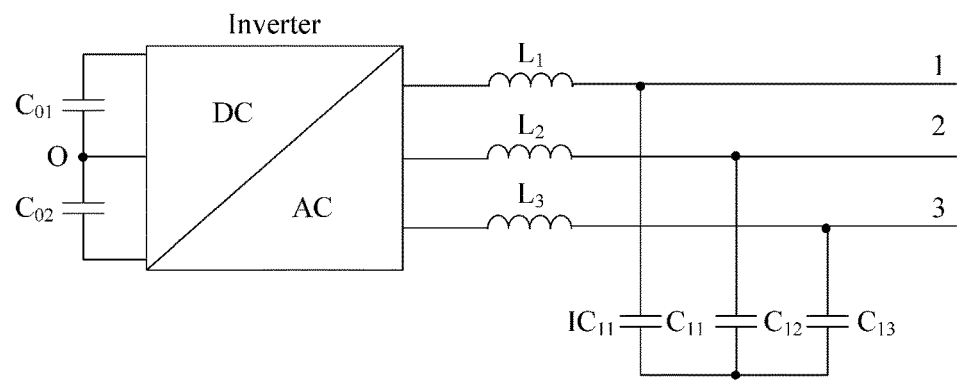
FIG. 3 is a schematic diagram of a connection relationship between a three-phase inverter and a first filter capacitor according to an embodiment of this application.

As shown in FIG. 3, a current $\dot{I}_{C_{11}}$ of a first filter capacitor $C_{11}$ connected to an inductor $L_1$ of a first output terminal of the inverter, a current $\dot{I}_{C_{12}}$ of a first filter capacitor $C_{12}$ connected to an inductor $L_2$ of a second output terminal of the inverter, and a current $\dot{I}_{C_{13}}$ of a first filter capacitor $C_{13}$ connected to an inductor $L_3$ of a third output terminal of the inverter are respectively:

$$\dot{I}_{C_{11}} = \frac{\dot{U}_1(Z_{C_{12}} + Z_{C_{13}}) - \dot{U}_2 Z_{C_{13}} - \dot{U}_3 Z_{C_{12}}}{Z_{C_{11}} Z_{C_{12}} + Z_{C_{12}} Z_{C_{13}} + Z_{C_{13}} Z_{C_{11}}},$$

$$\dot{I}_{C_{12}} = \frac{\dot{U}_2(Z_{C_{13}} + Z_{C_{11}}) - \dot{U}_3 Z_{C_{11}} - \dot{U}_1 Z_{C_{13}}}{Z_{C_{11}} Z_{C_{12}} + Z_{C_{12}} Z_{C_{13}} + Z_{C_{13}} Z_{C_{11}}}, \text{ and}$$

$$\dot{I}_{C_{13}} = \frac{\dot{U}_3(Z_{C_{11}} + Z_{C_{12}}) - \dot{U}_1 Z_{C_{12}} - \dot{U}_2 Z_{C_{11}}}{Z_{C_{11}} Z_{C_{12}} + Z_{C_{12}} Z_{C_{13}} + Z_{C_{13}} Z_{C_{11}}},$$

where $\dot{U}_1$ is a voltage output by the first output terminal of the inverter, $\dot{U}_2$ is a voltage output by the second output terminal of the inverter, $\dot{U}_3$ is a voltage output by the third output terminal of the inverter, $Z_{C_{11}}$ is an impedance of the first filter capacitor $C_{11}$, $Z_{C_{12}}$ an impedance of the first filter capacitor $C_{12}$, and $Z_{C_{13}}$ is an impedance of the first filter capacitor $C_{13}$.

When a first voltage output by the second output terminal of the inverter is $\dot{U}_{12}=U\angle\alpha_2$, that is, $\dot{U}_2=\dot{U}_{12}=U\angle\alpha_2$, and a first voltage $\dot{U}_{11}$ output by the first output terminal of the inverter and a first voltage $\dot{U}_{13}$ output by the third output terminal of the inverter are zero, that is, $\dot{U}_1=\dot{U}_3=\dot{U}_{11}=\dot{U}_{13}=0$, $\dot{I}_{C_{11}}$ and $\dot{I}_{C_{13}}$ are respectively $$\dot{I}_{C_{11}} = \frac{-\dot{U}_2 Z_{C_{13}}}{Z_{C_{11}} Z_{C_{12}} + Z_{C_{12}} Z_{C_{13}} + Z_{C_{13}} Z_{C_{11}}} \text{ and}$$

$$\dot{I}_{C_{13}} = \frac{\dot{U}_2 Z_{C_{11}}}{Z_{C_{11}} Z_{C_{12}} + Z_{C_{12}} Z_{C_{13}} + Z_{C_{13}} Z_{C_{11}}}.$$

Therefore, $$\frac{|\dot{I}_{C_{11}}|}{|\dot{I}_{C_{13}}|} = \frac{Z_{C_{13}}}{Z_{C_{11}}} = l_{13}.$$

Similarly, when the first voltage output by the third output terminal of the inverter is $\dot{U}_{13}=U\angle\alpha_3$, that is, $\dot{U}_3=\dot{U}_{13}=U\angle\alpha_3$, and the first voltage $\dot{U}_{11}$ output by the first output terminal of the inverter and the first voltage $\dot{U}_{12}$ output by the second output terminal of the inverter are zero, that is, $\dot{U}_1=\dot{U}_2=\dot{U}_{11}=\dot{U}_{12}=0$, $\dot{I}_{C_{11}}$ and $\dot{I}C_{12}$ are respectively $$\dot{I}_{C_{11}} = \frac{-\dot{U}_3 Z_{C_{12}}}{Z_{C_{11}} Z_{C_{12}} + Z_{C_{12}} Z_{C_{13}} + Z_{C_{13}} Z_{C_{11}}} \text{ and}$$

$$\dot{I}_{C_{12}} = \frac{-\dot{U}_3 Z_{C_{11}}}{Z_{C_{11}} Z_{C_{12}} + Z_{C_{12}} Z_{C_{13}} + Z_{C_{13}} Z_{C_{11}}}.$$

Therefore, $$\frac{|\dot{I}_{C_{11}}|}{|\dot{I}_{C_{12}}|} = \frac{Z_{C_{12}}}{Z_{C_{11}}} = l_{12}.$$

In this case, ($\dot{U}_3=\dot{U}_{13}=U\angle 120°$, $\dot{U}_1=\dot{U}_2=\dot{U}_{11}=\dot{U}_{12}=0$), a current $\dot{I}_{L_1}$ of the inductor $L_1$ is $$\dot{I}_{L_1} = \dot{I}_{C_{11}} = \frac{-\dot{U}_3 Z_{C_{12}}}{Z_{C_{11}} Z_{C_{12}} + Z_{C_{12}} Z_{C_{13}} + Z_{C_{13}} Z_{C_{11}}} = \frac{-\dot{U}_{13} l_{12}}{l_{13} Z_{C_{11}} + l_{12} l_{13} Z_{C_{11}} + l_{12} Z_{C_{11}}}.$$

Therefore, capacitance of the first filter capacitor $C_{11}$ connected to the inductor $L_1$ is:

$$C_{11} = \frac{\dot{I}_{C_{11}}}{2\pi f \dot{U}_{C_{11}}} = \frac{|\dot{I}_{L1}|(l_{13} + l_{12} + l_{13} l_{12})}{|\dot{U}_{13}|l_{12}} \cdot \frac{1}{2\pi f_1},$$

where $\dot{I}_{C_{11}}$ is a current of the first filter capacitor $C_{11}$, $\dot{U}_{C_{11}}$ is a voltage of two terminals of the first filter capacitor $C_{11}$, and $f_1$ is a frequency of the first voltage $\dot{U}_{13}$.

The capacitance of the first filter capacitor $C_{11}$ may also be calculated in the following scenario: When the first voltage output by the second output terminal of the inverter is $\dot{U}_{12}=U\angle\alpha_3$, that is, $\dot{U}_2=\dot{U}_{12}=U\angle\alpha_3$, and the first voltage $\dot{U}_{11}$ output by the first output terminal of the inverter and the first voltage $\dot{U}_{13}$ output by the third output terminal of the inverter are zero, that is, $\dot{U}_1=\dot{U}_3=\dot{U}_{11}=\dot{U}_{13}=0$, where $\dot{I}_{C_{11}}$ is a current of the first filter capacitor $C_{11}$, and $\dot{U}_{C_{11}}$ is a voltage of two terminals of the first filter capacitor $C_{11}$. In the foregoing scenario, the current $\dot{I}_{L_1}$ of the inductor $L_1$ is $$\dot{I}_{L_1} = \dot{I}_{C_{11}} = \frac{-\dot{U}_2 Z_{C_{13}}}{Z_{C_{11}} Z_{C_{12}} + Z_{C_{12}} Z_{C_{13}} + Z_{C_{13}} Z_{C_{11}}} = \frac{-\dot{U}_{12} l_{13}}{l_{13} Z_{C_{11}} + l_{12} l_{13} Z_{C_{11}} + l_{12} Z_{C_{11}}}.$$

Therefore, capacitance of the first filter capacitor $C_{11}$ connected to the inductor $L_1$ is:

$$C_{11} = \frac{\dot{I}_{C_{11}}}{2\pi f \dot{U}_{C_{11}}} = \frac{|\dot{I}_{L1}|(l_{13} + l_{12} + l_{13}l_{12})}{|\dot{U}_{12}|l_{13}} \cdot \frac{1}{2\pi f_1'},$$

where $f_1'$ is a frequency of the first voltage $\dot{U}_{12}$, and $f_1'$ may be the same as or other than $f_1$.

$$\frac{Z_{C_{13}}}{Z_{C_{11}}} = \frac{C_{11}}{C_{13}} = l_{13} \text{ and } \frac{Z_{C_{12}}}{Z_{C_{11}}} = \frac{C_{11}}{C_{12}} = l_{12}, \text{ so}$$

$$C_{12} = \frac{C_{11}}{l_{12}} \text{ and } C_{13} = \frac{C_{11}}{l_{13}}.$$

Figure 4:
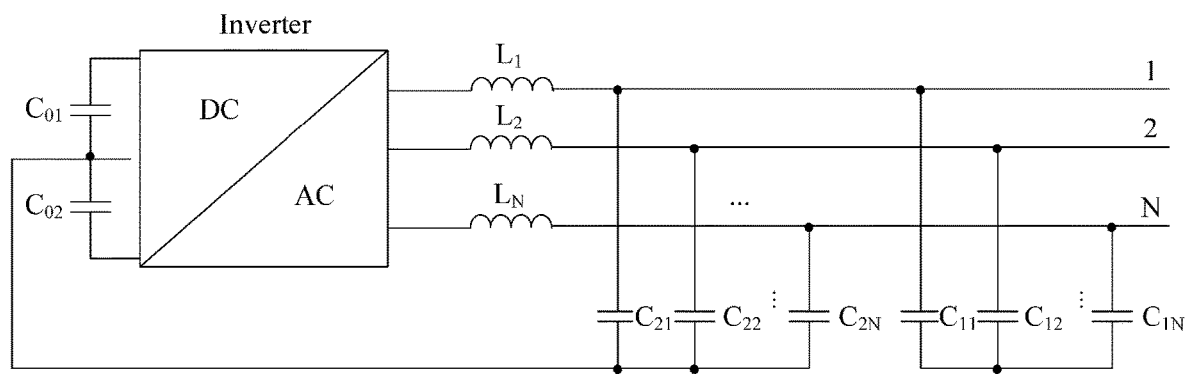
FIG. 4 is a schematic diagram of a connection relationship between an inverter and a second filter capacitor according to an embodiment of this application.
Figure 5:
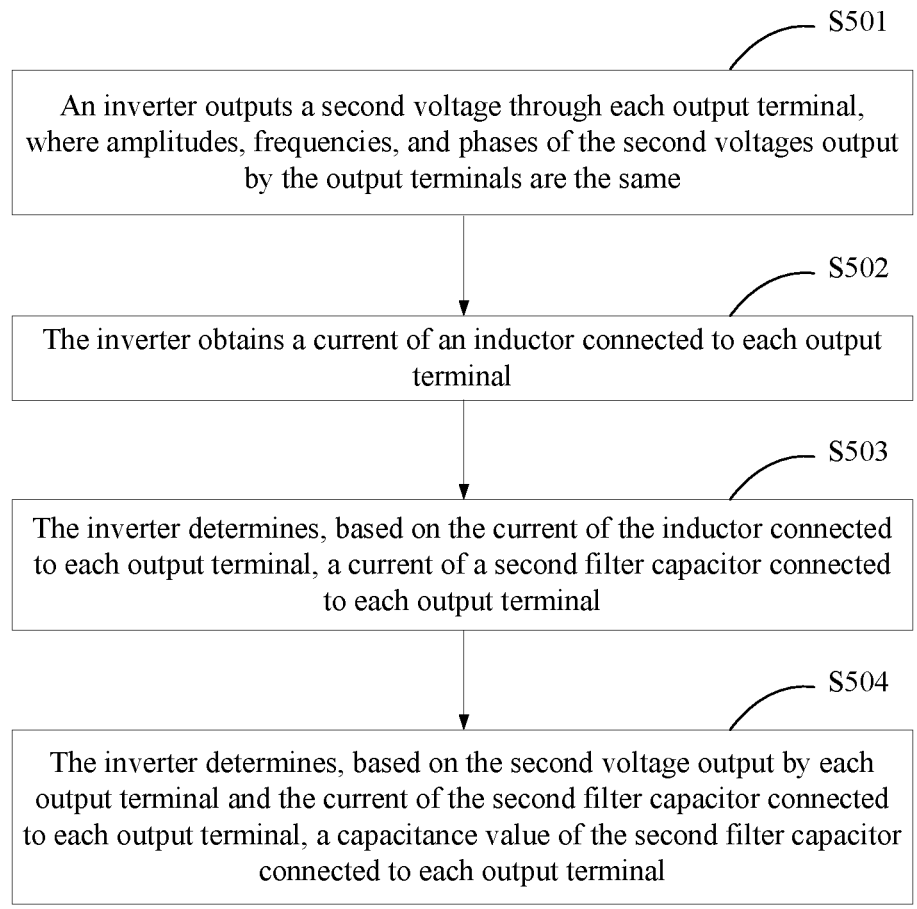
FIG. 5 is a schematic flowchart of a method for detecting capacitance of a second filter capacitor by an inverter according to an embodiment of this application.

In an implementation, each output terminal of the inverter may be further connected to one terminal of a second filter capacitor through an inductor, and the other terminals of all second filter capacitors are all connected to a midpoint of a direct current bus of the inverter. As shown in FIG. 4, when the inverter has N output terminals for outputting alternating currents, a first output terminal of the inverter is connected to one terminal of a second capacitor $C_{21}$ through an inductor $L_1$, a second output terminal of the inverter is connected to one terminal of a second capacitor $C_{22}$ through the inductor $L_2, \ldots,$ an $N^{th}$ output terminal of the inverter is connected to one terminal of a second capacitor $C_{2N}$ through an inductor $L_N$; and the other terminals of the second capacitor $C_{21}$, the second capacitor $C_{22}, \ldots,$ and the second capacitor $C_{2N}$ are all connected to a midpoint O of a direct current bus of the inverter. As shown in FIG. 5, the inverter may detect capacitance of each second filter capacitor by performing the following operations.

S501: The inverter outputs a second voltage through each output terminal, where amplitudes, frequencies, and phases of the second voltages output by the output terminals are the same.

S502: The inverter obtains a current of an inductor connected to each output terminal.

The inverter may obtain, in a same way as that in operation S203, the current of the inductor connected to each output terminal when each output terminal of the inverter outputs the second voltage. Details are not described herein again. For the obtaining the current of the inductor connected to each output terminal when each output terminal of the inverter outputs the second voltage, refer to the related descriptions of operation S203.

S503: The inverter determines, based on the current of the inductor connected to each output terminal, a current of the second filter capacitor connected to each output terminal.

When each output terminal of the inverter outputs the second voltage, the current flowing through the inductor connected to each output terminal completely flows back to the midpoint of the direct current bus of the inverter through a corresponding second filter capacitor without flowing through the corresponding first filter capacitor. Therefore, when each output terminal of the inverter outputs the second voltage, the current of the second filter capacitor connected to each output terminal is equal to the current of the inductor connected to each output terminal.

S504: The inverter determines, based on the second voltage output by each output terminal and the current of the second filter capacitor connected to each output terminal, capacitance of the second filter capacitor connected to each output terminal.

Through operations S501 and S502, the inverter can detect the capacitance of the second filter capacitor of the inverter by controlling common-mode voltages (voltages with the same magnitude, phase, and frequency) output by the inverter and obtaining the current of the inductor connected to the output terminal of the inverter. In this way, an external device (for example, an excitation source) for detecting the second filter capacitor does not need to be added, thereby reducing detection costs for the filter capacitor of the inverter.

In an implementation, the capacitance, of the second filter capacitor connected to each output terminal, determined in operation S504 meets the following formula:

$$C_{2n} = \frac{|\dot{I}_{C_{2n}}|}{2\pi f_2 |\dot{U}_2|},$$

where $C_{2n}$ is capacitance of a second filter capacitor connected to an $n^{th}$ output terminal of the inverter, $|\dot{I}_{C_{2n}}|$ is a magnitude of a current $\dot{I}_{C_{2n}}$ of the second filter capacitor connected to the $n^{th}$ output terminal, $f_2$ is a frequency of a second voltage $\dot{U}_2$ output by the $n^{th}$ output terminal, $|\dot{U}_2|$ is a magnitude of the second voltage $\dot{U}_2$, and $1 \leq n \leq N$, where n is a positive integer.

In an implementation, the capacitance of the second filter capacitor connected to each output terminal of the inverter meets $$C_{2n} = \frac{|\dot{I}_{C_{2n}}|}{2\pi f_2 |\dot{U}_2|}.$$

In other words, the amplitude and the frequency of the second voltage output by the inverter and accuracy of the obtained inductor current all affect measurement accuracy of the second filter capacitor. Therefore, the amplitude of the second voltage output by the inverter and the frequency of the second voltage output by the inverter can be determined based on the accuracy of the inductor current obtained by the inverter and rated capacitance of the second filter capacitor.

When the amplitude of the second voltage output by the inverter is constant, a higher frequency of the second voltage output by the inverter indicates a larger inductor current obtained by the inverter. Therefore, when the amplitude of the second voltage output by the inverter is constant, the inverter can increase detection accuracy of the second filter capacitor by increasing the frequency of the second voltage.

In this embodiment of this application, the inverter controls a voltage output by one output terminal of the inverter to be always zero, controls other output terminals of the inverter to sequentially output a first voltage, and when one output terminal of the inverter outputs the first voltage, controls voltages output by the other output terminals of the inverter to be zero; the inverter obtains a current of the inductor connected to each output terminal of the inverter when one output terminal of the inverter outputs the first voltage and the voltages output by the other output terminals of the inverter are zero; the inverter determines a ratio of a current of an inductor connected to the output terminal with the output voltage being always zero in the inverter to a current of an inductor connected to each of the other output terminals in the inverter; and the inverter determines, based on the first voltage, the determined ratio, and the current of the inductor connected to the output terminal with the output voltage being always zero, capacitance of a first filter capacitor corresponding to the inductor connected to the output terminal with the output voltage being always zero. In other words, the inverter can detect the capacitance of the first filter capacitor of the inverter by controlling a voltage output by the inverter and obtaining the current of the inductor connected to the output terminal of the inverter. In this way, an external device (for example, an excitation source) for detecting the first filter capacitor does not need to be added, thereby reducing detection costs for the filter capacitor of the inverter. Further, an operating status of the inverter can be monitored based on the detected capacitance of the first filter capacitor, thereby improving operating reliability of the inverter.

Figure 6:
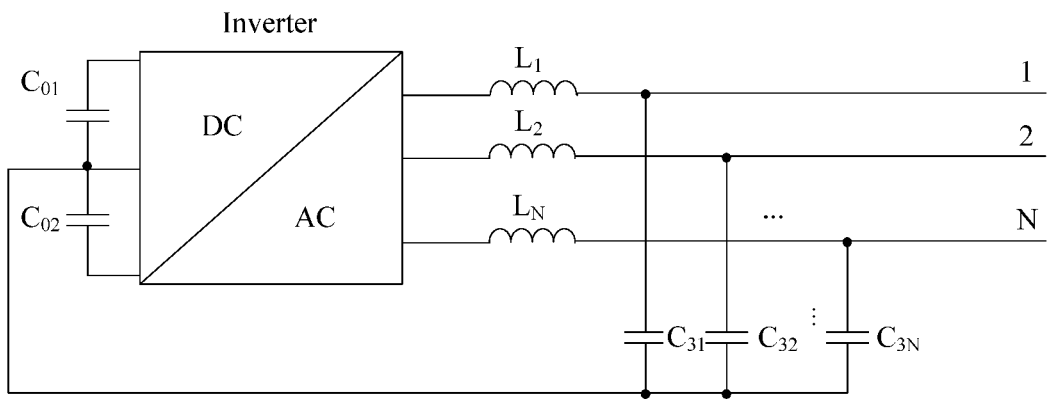
FIG. 6 is a schematic diagram of a connection relationship between an inverter and a second filter capacitor according to an embodiment of this application.

An embodiment of this application further provides another method for detecting capacitance of a filter capacitor of an inverter, where each output terminal of the inverter is connected to one terminal of a third filter capacitor through an inductor, and the other terminals of all third filter capacitors are all connected to a midpoint of a direct current bus of the inverter. As shown in FIG. 6, when the inverter has N output terminals for outputting alternating currents, a first output terminal of the inverter is connected to one terminal of a third capacitor $C_{31}$ through an inductor $L_1$, a second output terminal of the inverter is connected to one terminal of a third capacitor $C_{32}$ through an inductor $L_2$, . . . , an $N^{th}$ output terminal of the inverter is connected to one terminal of a third capacitor $C_{3N}$ through an inductor $L_N$; and the other terminals of the third capacitor $C_{31}$, the third capacitor $C_{32}$, . . . , and the third capacitor $C_{3N}$ are all connected to a midpoint O of a direct current bus of the inverter. Two bus capacitors $C_{01}$ and $C_{02}$ may be further connected at a midpoint O of a direct current bus of the inverter to stabilize a direct current voltage input to the inverter.

Figure 7:
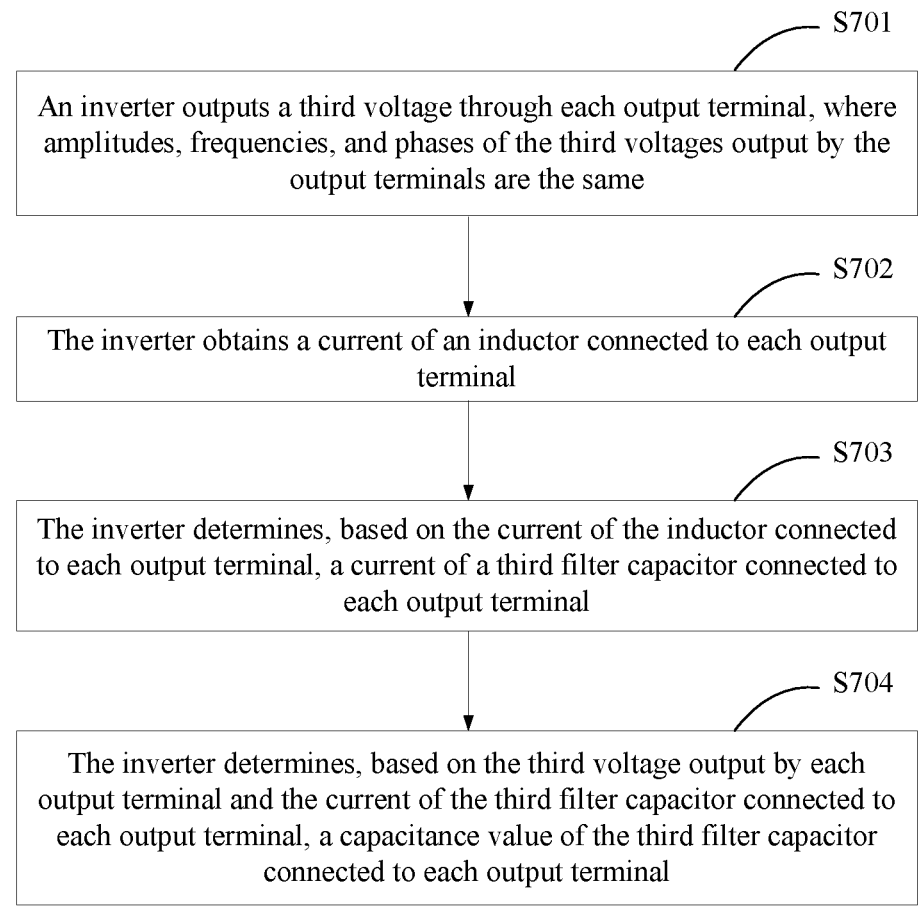
FIG. 7 is a schematic flowchart of another method for detecting capacitance of a filter capacitor of an inverter according to an embodiment of this application.

As shown in FIG. 7, the inverter may detect capacitance of each third filter capacitor by performing the following operations.

S701: The inverter outputs a third voltage through each output terminal, where amplitudes, frequencies, and phases of the third voltages output by the output terminals are the same.

S702: The inverter obtains a current of an inductor connected to each output terminal.

S703: The inverter determines, based on the current of the inductor connected to each output terminal, a current of the third filter capacitor connected to each output terminal.

S704: The inverter determines, based on the third voltage output by each output terminal and the current of the third filter capacitor connected to each output terminal, capacitance of the third filter capacitor connected to each output terminal.

A method for obtaining, by the inverter, the current of the inductor connected to each output terminal in operation S702 is the same as a method for obtaining, by the inverter, the current of the inductor connected to each output terminal in S502. A method for determining, by the inverter, the current of the third filter capacitor connected to each output terminal in operation S703 is the same as a method for determining, by the inverter, the current of the second filter capacitor connected to each output terminal in operation S503. A method for determining, by the inverter, the capacitance of the third filter capacitor connected to each output terminal in operation S704 is the same as a method for determining, by the inverter, the capacitance of the second filter capacitor connected to each output terminal in S504. Details are not described herein again. Refer to the related descriptions of operations S502 to S504.

In this embodiment of this application, the inverter obtains, by controlling the output terminals of the inverter to output third voltages with the same magnitude, phase, and frequency (namely, common-mode voltages), the current of the inductor connected to each output terminal; determines, based on the obtained inductor current, the current of the third filter capacitor connected to each output terminal; and determines, based on the third voltage output by each output terminal and the current of the third filter capacitor connected to each output terminal, the capacitance of the third filter capacitor connected to each output terminal. In other words, the inverter can detect the capacitance of the third filter capacitor of the inverter by controlling a voltage output by the inverter and obtaining the current of the inductor connected to the output terminal of the inverter. In this way, an external device (for example, an excitation source) for detecting the third filter capacitor does not need to be added, thereby reducing detection costs for the filter capacitor of the inverter. Further, an operating status of the inverter can be monitored based on the detected capacitance of the first filter capacitor, thereby improving operating reliability of the inverter.

Figure 8:
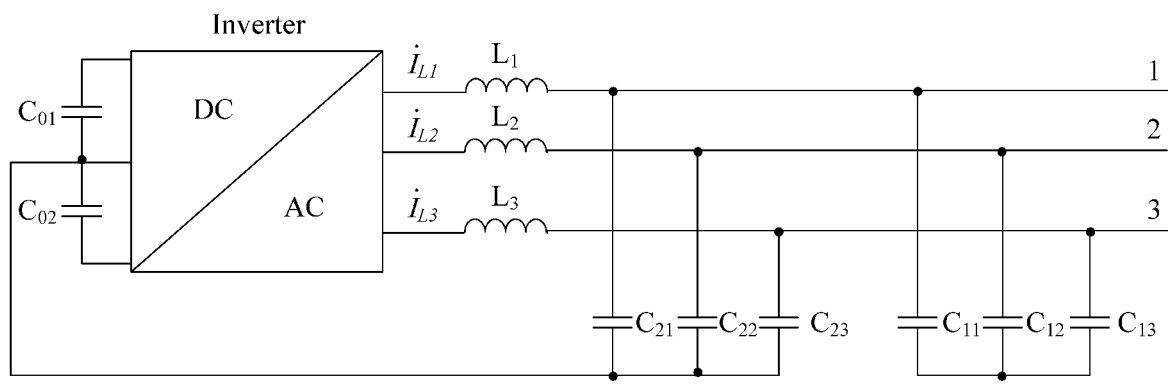
FIG. 8 is a schematic diagram of a connection relationship between a three-phase inverter and a first filter capacitor and between the three-phase inverter and a second filter capacitor according to an embodiment of this application.

The following uses two specific embodiments to describe in detail the method for detecting capacitance of a filter capacitor of an inverter provided by this application. As shown in FIG. 8, the inverter has three output terminals for outputting alternating currents. A first output terminal of the inverter is connected to one terminal of a first filter capacitor $C_{11}$ and one terminal of a second filter capacitor $C_{21}$ through an inductor $L_1$, a second output terminal of the inverter is connected to one terminal of a first filter capacitor $C_{12}$ and one terminal of a second filter capacitor $C_{22}$ through an inductor $L_2$, and a third output terminal of the inverter is connected to one terminal of a first filter capacitor $C_{13}$ and one terminal of a second filter capacitor $C_{23}$ through an inductor $L_3$. The other terminals of the first filter capacitor $C_{11}$, the first filter capacitor $C_{12}$, and the first filter capacitor $C_{13}$ are interconnected. The other terminals of the second filter capacitor $C_{21}$, the second filter capacitor $C_{22}$, and the second filter capacitor $C_{23}$ are all connected to a midpoint of a direct current bus of the inverter.

In embodiment 1, a method for detecting capacitance of the first filter capacitor $C_{11}$, the first filter capacitor $C_{12}$, and the first filter capacitor $C_{13}$ by the inverter shown in FIG. 8 include the following operations.

1. The inverter controls a voltage $\dot{U}_{11}$ output by the first output terminal of the inverter and a voltage $\dot{U}_{13}$ output by the third output terminal of the inverter to be zero, and controls the second output terminal of the inverter to output a first voltage $\dot{U}_{12}=U\angle-120°$.

When a magnitude of the first voltage and inductor current sampling accuracy are constant, a frequency of the first voltage is determined based on the magnitude of the first voltage, the inductor current sampling accuracy, and rated capacitance of the first filter capacitor, to increase capacitance detection accuracy of the first filter capacitor.

2. The inverter obtains, through a current sensor, a current $\dot{I}_{L_1}$ of the inductor $L_1$ and a current $\dot{I}_{L_3}$ of the inductor $L_3$ when $\dot{U}_{11}=\dot{U}_{13}=0$ and $\dot{U}_{12}=U\angle-120°$.

3. The inverter calculates a ratio of $|\dot{I}_{L_1}|$ to $|\dot{I}_{L_3}|$, $$l_{13} = \frac{|\dot{I}_{L1}|}{|\dot{I}_{L3}|} = \frac{Z_{C_{13}}}{Z_{C_{11}}},$$

when $\dot{U}_{11}=\dot{U}_{12}=0$ and $\dot{U}_{13}=U\angle 120°$.

4. The inverter controls the voltage $\dot{U}_{11}$ output by the first output terminal of the inverter and the voltage $\dot{U}_{11}$ output by the second output terminal of the inverter to be zero, and controls the third output terminal of the inverter to output the first voltage $\dot{U}_{13}=U\angle 120°$.

5. The inverter obtains, through the current sensor, a current $\dot{I}_{L_1}$ of the inductor $L_1$ and a current $\dot{I}_{L_2}$ of the inductor $L_2$ when $\dot{U}_{11}=\dot{U}_{12}=0$ and $\dot{U}_{13}=U\angle 120°$.

6. The inverter calculates a ratio of $|\dot{I}_{L_1}|$ to $|\dot{I}_{L_2}|$, $$l_{12} = \frac{|\dot{I}_{L1}|}{|\dot{I}_{L2}|} = \frac{Z_{C_{12}}}{Z_{C_{11}}},$$

when $\dot{U}_{11}=\dot{U}_{12}=0$ and $\dot{U}_{13}=U\angle 120°$.

It should be noted that this embodiment of this application does not limit a sequence of performing operations 1 to 3 and operations 4 to 6 by the inverter. The inverter may perform operations 1 to 3 before operations 4 to 6, or may perform operations 4 to 6 before operations 1 to 3.

7. The inverter determines, based on the current $\dot{I}_{L_1}$ of the inductor $L_1$, $\dot{U}_{13}$, $l_{12}$, and $l_{13}$ when $\dot{U}_{11}=\dot{U}_{12}=0$ capacitance of the first filter capacitor $C_{11}$, where
the capacitance of the first filter capacitor $C_{11}$ is $$C_{11} = \frac{|\dot{I}_{L1}|(l_{13}+l_{12}+l_{13}l_{12})}{|\dot{U}_{13}|l_{12}}.$$

Alternatively, the inverter determines, based on the current $\dot{I}_{L_1}$ of the inductor $L_1$, $\dot{U}_{12}$, $l_{12}$, and $l_{13}$ when $\dot{U}_{11}=\dot{U}_{12}=0$ and $\dot{U}_{13}=U\angle 120°$, capacitance of the first filter capacitor $C_{11}$, where
the capacitance of the first filter capacitor $C_{11}$ is $$C_{11} = \frac{|\dot{I}_{L1}|(l_{13}+l_{12}+l_{13}l_{12})}{|\dot{U}_{12}|l_{13}}.$$

8. The inverter determines, based on the capacitance of the first filter capacitor $C_{11}$, $l_{12}$ and $l_{13}$, capacitance of the first filter capacitor $C_{12}$ and capacitance of the first filter capacitor $C_{13}$, where
the capacitance of the first filter capacitor $C_{12}$ is $$C_{12} = \frac{C_{11}}{l_{12}},$$

and the capacitance of the first filter capacitor $C_{13}$ is $$C_{13} = \frac{C_{11}}{l_{13}}.$$

In embodiment 2, a method for detecting capacitance of the second filter capacitor $C_{21}$, the second filter capacitor $C_{22}$, and the second filter capacitor $C_{23}$ by the inverter shown in FIG. 8 include the following operations.

1. The inverter controls the three output terminals of the inverter to respectively output second voltages $\dot{U}_{21}$, $\dot{U}_{22}$ and $\dot{U}_{23}$, where $\dot{U}_{21}=\dot{U}_{22}=\dot{U}_{23}$, that is, magnitudes, phases, and frequencies of $\dot{U}_{21}$, $\dot{U}_{22}$, and $\dot{U}_{23}$ are the same.

2. The inverter obtains a current $\dot{I}_{L_1}$ of the inductor $L_1$, a current $\dot{I}_{L_2}$ of the inductor $L_2$, and a current $\dot{I}_{L_3}$ of the inductor $L_3$.

When a magnitude of the second voltage and inductor current sampling accuracy are constant, a frequency of the second voltage is determined based on the magnitude of the second voltage, the inductor current sampling accuracy, and rated capacitance of the second filter capacitor, to increase capacitance detection accuracy of the second filter capacitor.

3. When the three output terminals of the inverter output $\dot{U}_{21}$, $\dot{U}_{22}$, and $\dot{U}_{23}$, respectively, $\dot{I}_{L_1}$, $\dot{I}_{L_2}$, and $\dot{I}_{L_3}$ flow back to the midpoint of the direct current bus of the inverter respectively through the second filter capacitor $C_{21}$, the second filter capacitor $C_{22}$, and the second filter capacitor $C_{23}$, instead of through the first filter capacitor $C_{11}$, the first filter capacitor $C_{12}$, and the first filter capacitor $C_{13}$. The inverter uses $\dot{I}_{L_1}$ as a current $\dot{I}_{C_{21}}$ of the second filter capacitor $C_{21}$, uses $\dot{I}_{L_2}$ as a current $\dot{I}_{C_{22}}$ of the second filter capacitor $C_{22}$, and uses $\dot{I}_{L_3}$ as a current $\dot{I}_{C_{23}}$ of the second filter capacitor $C_{23}$.

4. The inverter determines, based on $\dot{U}_{21}$, $\dot{U}_{22}$, $\dot{U}_{23}$, $\dot{I}_{C_{21}}$, $\dot{I}_{C_{22}}$, and $\dot{I}_{C_{23}}$, capacitance of the second filter capacitor $C_{21}$, the second filter capacitor $C_{22}$, and the second filter capacitor $C_{23}$, where
the capacitance of the second filter capacitor $C_{21}$ is $$C_{21} = \frac{|\dot{I}_{C_{21}}|}{2\pi f_2|\dot{U}_{21}|},$$

the capacitance of the second filter capacitor $C_{22}$ is $$C_{22} = \frac{|\dot{I}_{C_{22}}|}{2\pi f_2|\dot{U}_{22}|},$$

the capacitance of the second filter capacitor $C_{23}$ is $$C_{23} = \frac{|\dot{I}_{23}|}{2\pi f_2|\dot{U}_{23}|},$$

and $f_2$ is the frequency of the second voltage.

It should be noted that when the inverter has three output terminals for outputting alternating currents, the first output terminal of the inverter is connected to one terminal of the second filter capacitor $C_{21}$ through the inductor $L_1$, the second output terminal of the inverter is connected to one terminal of the second filter capacitor $C_{22}$ through the inductor $L_2$, the third output terminal of the inverter is connected to one terminal of the second filter capacitor $C_{23}$ through the inductor $L_3$, and the other terminals of the second filter capacitor $C_{21}$, the second filter capacitor $C_{22}$, and the second filter capacitor $C_{23}$ are all connected to the midpoint of the direct current bus of the inverter, that is, when each output terminal of the three-phase inverter is connected to a second filter capacitor only through an inductor, the methods for detecting the capacitance of the second filter capacitor $C_{21}$, the second filter capacitor $C_{22}$, and second filter capacitor $C_{23}$ by the three-phase inverter are the same. Refer to the descriptions of embodiment 2. Details are not described herein again.

Figure 9:
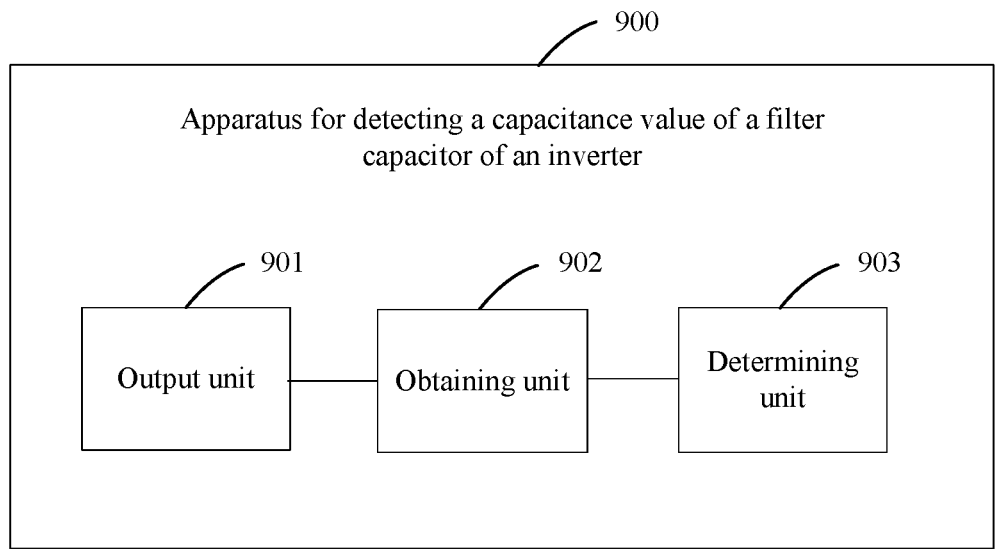
FIG. 9 is a schematic structural diagram of an apparatus for detecting capacitance of a filter capacitor of an inverter according to an embodiment of this application.

Based on the foregoing embodiments, an embodiment of this application further provides an apparatus for detecting capacitance of a filter capacitor of an inverter. As shown in FIG. 9, the apparatus 900 for detecting capacitance of a filter capacitor of an inverter includes an output unit 901, an obtaining unit 902, and a determining unit 903.

In an implementation, the apparatus 900 for detecting capacitance of a filter capacitor of an inverter is configured to implement the methods for detecting capacitance of a filter capacitor of the inverter shown in FIG. 2, FIG. 5 and FIG. 7. Each output terminal of the inverter is connected to one terminal of a first filter capacitor through an inductor, and the other terminals of all first filter capacitors are interconnected (as shown in FIG. 1).

The output unit 901 is configured to output a first voltage $\dot{U}_{1i}$ through an $i^{th}$ output terminal of the inverter, where a voltage output by an output terminal other than the $i^{th}$ output terminal is zero, $i=1, 2 \ldots N$, $i \ne j$, $1 \le j \le N$, i and j are positive integers, and N is a total quantity of output terminals of the inverter.

The obtaining unit 902 is configured to obtain $\dot{I}_{ik}$, where $\dot{I}_{ik}$ is a current of an inductor connected to a $k^{th}$ output terminal when the $i^{th}$ output terminal outputs the first voltage $\dot{U}_{1i}$, $k=1, 2 \ldots N$, and k is a positive integer.

The determining unit 903 is configured to: determine a ratio of $|\dot{I}_{ij}|$ to $|\dot{I}_{ik}|$, where $\dot{I}_{ij}$ is a current of an inductor connected to a $j^{th}$ output terminal when the $i^{th}$ output terminal of the inverter outputs the first voltage $\dot{U}_{1i}$, $|\dot{I}_{ij}|$ is a magnitude of $\dot{I}_{ij}$, $|\dot{I}_{ik}|$ is a magnitude of $\dot{I}_{ik}$, and $k \ne j$; and determine, based on $\dot{I}_{ij}$, $\dot{U}_{1i}$, and the ratio of $|\dot{I}_{ik}|$ to $|\dot{I}_{ij}|$, capacitance of a first filter capacitor connected to the $j^{th}$ output terminal.

Optionally, after determining the capacitance of the first filter capacitor connected to the $j^{th}$ output terminal, the determining unit is further configured to:

determine, based on the capacitance of the first filter capacitor connected to the $j^{th}$ output terminal and the ratio of $|\dot{I}_{ij}|$ to $|\dot{I}_{ik}|$ capacitance of a first filter capacitor connected to an output terminal other than the $j^{th}$ output terminal.

In an implementation, the capacitance of the first filter capacitor connected to the output terminal other than the $j^{th}$ output terminal meets the following formula:

$$C_1 = \frac{C_{1j}}{l},$$

where $C_1$ is capacitance of any first filter capacitor connected to the output terminal other than the $j^{th}$ output terminal, $C_{1j}$ is the capacitance of the first filter capacitor connected to the $j^{th}$ output terminal, and l is a ratio of $|\dot{I}_{ij}|$ to a current amplitude of an inductor connected to the any first filter capacitor.

Optionally, when N=3, the capacitance of the first filter capacitor connected to the $j^{th}$ output terminal meets the following formula:

$$C_{1j} = \frac{|\dot{I}_{ij}|(l_1 + l_2 + l_1 l_2)}{|\dot{U}_{1i}|l_1} \cdot \frac{1}{2\pi f_1},$$

where $C_{ij}$ is the capacitance of the first filter capacitor connected to the $j^{th}$ output terminal, $l_1$ is a ratio of $|\dot{I}_{ij}|$ to $|\dot{I}_{i(6-i-k)}|$, $\dot{I}_{i(6-i-j)}$ is a current of an inductor connected to a $(6-i-j)^{th}$ output terminal when the $i^{th}$ output terminal of the inverter outputs the first voltage $\dot{U}_{1i}$, $|\dot{I}_{i(6-i-j)}|$ a magnitude of $\dot{I}_{i(6-i-j)}$, $l_2$ is a ratio of $|\dot{I}_{(6-i-j)i}|$ to $|\dot{I}_{(6-i-j)j}|$, $\dot{I}_{(6-i-j)j}$ is a current of the inductor connected to the $j^{th}$ output terminal when the $(6-i-j)^{th}$ output terminal of the inverter outputs a first voltage $\dot{U}_{1(6-i-j)}$, $\dot{I}_{(6-i-j)i}$ a current of an inductor connected to the $i^{th}$ output terminal when the $(6-i-j)^{th}$ output terminal of the and $f_1$ is a frequency of the first voltage $\dot{U}_{1i}$.

Optionally, each output terminal of the inverter is connected to one terminal of a second filter capacitor through an inductor, and the other terminals of all second filter capacitors are all connected to a midpoint of a direct current bus of the inverter.

The output unit 901 is further configured to output a second voltage through each output terminal, where amplitudes, frequencies, and phases of the second voltages output by the output terminals are the same.

The obtaining unit 902 is further configured to obtain a current of the inductor connected to each output terminal.

The determining unit 903 is further configured to: determine, based on the current of the inductor connected to each output terminal, a current of the second filter capacitor connected to each output terminal; and determine, based on the second voltage output by each output terminal and the current of the second filter capacitor connected to each output terminal, capacitance of the second filter capacitor connected to each output terminal.

Optionally, the determined capacitance of the second filter capacitor connected to each output terminal meets the following formula:

$$C_{2n} = \frac{|\dot{I}_{C_{2n}}|}{2\pi f_2 |\dot{U}_2|},$$

where $C_{2n}$ is capacitance of a second filter capacitor connected to an $n^{th}$ output terminal of the inverter, $|\dot{I}_{C_{2n}}|$ is a magnitude of a current $\dot{I}_{C_{2n}}$ of the second filter capacitor connected to the $n^{th}$ output terminal, $f_2$ is a frequency of a second voltage $\dot{U}_2$ output by the $n^{th}$ output terminal, $|\dot{U}_2|$ is a magnitude of the second voltage $\dot{U}_2$, and $1 \le n \le N$, where n is a positive integer.

This embodiment of this application provides the apparatus for detecting capacitance of a filter capacitor of an inverter. The apparatus can detect the capacitance of the first filter capacitor of the inverter by outputting, through the output terminal of the inverter, a voltage for detecting the first filter capacitor, and obtaining the current of the inductor connected to the output terminal of the inverter. In this way, an external device (for example, an excitation source) for detecting the first filter capacitor does not need to be added, thereby reducing detection costs for the filter capacitor of the inverter. Further, an operating status of the inverter can be monitored based on the detected capacitance of the first filter capacitor, thereby improving operating reliability of the inverter.

In another implementation, the apparatus 900 for detecting capacitance of a filter capacitor of an inverter is configured to implement the method for detecting capacitance of a filter capacitor of an inverter shown in FIG. 7. Each output terminal of the inverter is connected to one terminal of a third filter capacitor through an inductor, and the other terminals of all third filter capacitors are all connected to a midpoint of a direct current bus of the inverter.

The output unit 901 is configured to output a third voltage through each output terminal, where amplitudes, frequencies, and phases of the third voltages output by the output terminals are the same.

The obtaining unit 902 is configured to obtain a current of the inductor connected to each output terminal.

The determining unit 903 is configured to: determine, based on the current of the inductor connected to each output terminal, a current of the third filter capacitor connected to each output terminal; and determine, based on the third voltage output by each output terminal and the current of the third filter capacitor connected to each output terminal, capacitance of the third filter capacitor connected to each output terminal.

Optionally, the determined capacitance of the third filter capacitor connected to each output terminal meets the following formula:

$$C_{3n} = \frac{|\dot{I}_{C_{3n}}|}{2\pi f_3 |\dot{U}_{3n}|},$$

where $C_{3n}$ is capacitance of a third filter capacitor connected to an $n^{th}$ output terminal of the inverter, $\dot{I}_{C_{3n}}$ is a magnitude of a current of the third filter capacitor connected to the $n^{th}$ output terminal, $f_3$ is a frequency of a third voltage output by the $n^{th}$ output terminal, $\dot{U}_{3n}$ is a magnitude of the third voltage, and $1 \leq n \leq N$, where n is a positive integer.

This embodiment of this application provides the apparatus for detecting capacitance of a filter capacitor of an inverter. The apparatus can detect the capacitance of the third filter capacitor of the inverter by outputting, through the output terminal of the inverter, a voltage for detecting the third filter capacitor, and obtaining the current of the inductor connected to the output terminal of the inverter. In this way, an external device (for example, an excitation source) for detecting the third filter capacitor does not need to be added, thereby reducing detection costs for a filter capacitor of the inverter. Further, an operating status of the inverter can be monitored based on the detected capacitance of the third filter capacitor, thereby improving operating reliability of the inverter.

It should be noted that, in this embodiment of this application, unit division is an example, and is merely a logical function division. In actual implementation, another division manner may be used. Function modules in the embodiments of this application may be integrated into one processing unit, or each of the units may exist alone physically, or two or more units are integrated into one unit. The integrated unit may be implemented in a form of hardware, or may be implemented in a form of a software function unit.

When the integrated unit is implemented in the form of a software function unit and sold or used as a standalone product, the integrated unit may be stored in a computer-readable storage medium. Based on such an understanding, the technical solutions of this application essentially, or the part contributing to the prior art, or all or some of the technical solutions may be implemented in the form of a software product. The computer software product is stored in a storage medium and includes several instructions for enabling a computer device (which may be a personal computer, a server, a network device, or the like) or a processor to perform all or some of the operations of the methods described in the embodiments of this application. Moreover, the foregoing storage medium includes a medium that can store program code such as a removable hard disk, a read-only memory (ROM), or a random access memory (RAM).

Figure 10:
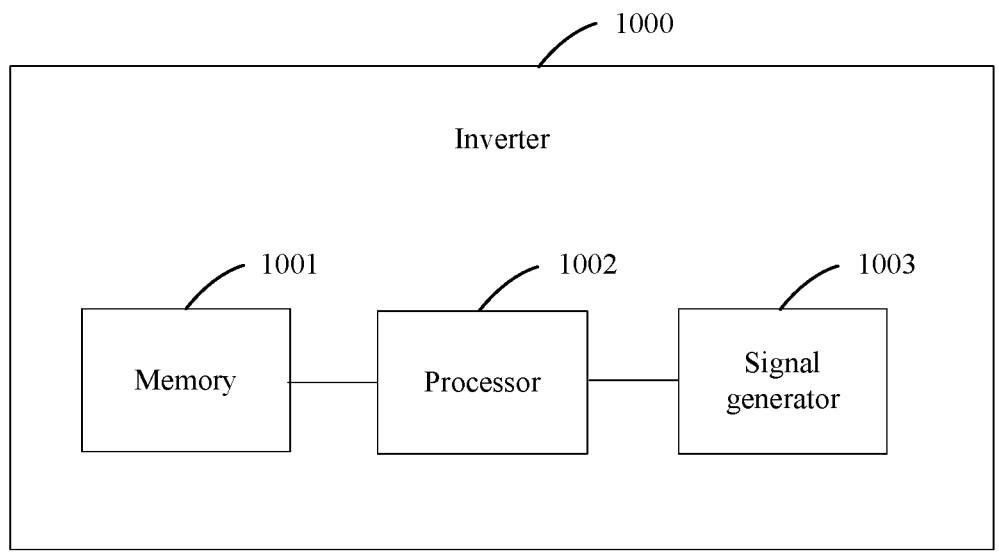
FIG. 10 is a schematic structural diagram of an inverter according to an embodiment of this application.

An embodiment of this application further provides an inverter. As shown in FIG. 10, the inverter 1000 includes a memory 1001, a processor 1002, and a signal generator 1003.

The memory 1001 may include a volatile memory, for example, a random-access memory (RAM). The memory 1001 may also include a non-volatile memory, for example, a flash memory, a hard disk drive (HDD) or a solid-state drive (SSD). The memory 1001 may further include a combination of the foregoing types of memories.

The processor 1002 may be a central processing unit (CPU), a network processor (NP), or a combination thereof. The processor 1002 may further include a hardware chip. The hardware chip may be an application-specific integrated circuit (ASIC), a programmable logic device (PLD), or a combination thereof. The PLD may be a complex programmable logic device (CPLD), a field-programmable gate array (FPGA), a generic array logic (GAL), or any combination thereof.

In an implementation, the inverter 1000 is configured to implement the methods for detecting capacitance of a filter capacitor of an inverter shown in FIG. 2, FIG. 5 and FIG. 7, and has a function of the apparatus 900 for detecting capacitance of a filter capacitor of an inverter shown in FIG. 9. Each output terminal of the inverter is connected to one terminal of a first filter capacitor through an inductor, and the other terminals of all first filter capacitors are interconnected.

The memory 1001 is configured to store a program instruction.

The processor 1002 is configured to invoke the program instruction stored in the memory 1001 to:

control the signal generator 1003 to output a first voltage $\dot{U}_{1i}$ through an $i^{th}$ output terminal of the inverter, where a voltage output by an output terminal other than the $i^{th}$ output terminal is zero, i=1, 2 ... N, i≠j, 1≤j≤N, i and j are positive integers, and N is a total quantity of output terminals of the inverter;

obtain $\dot{I}_{ik}$, where $\dot{I}_{ik}$ is a current of an inductor connected to a $k^{th}$ output terminal when the $i^{th}$ output terminal outputs the first voltage $\dot{U}_{1i}$, k=1, 2 ... N, and k is a positive integer; and determine a ratio of $|\dot{I}_{ij}|$ to $|\dot{I}_{ik}|$, to where $\dot{I}_{ij}$ is a current of an inductor connected to a $j^{th}$ output terminal when the $i^{th}$ output terminal of the inverter outputs the first voltage $\dot{U}_{1i}$, $|\dot{I}_{ij}|$ is a magnitude of $\dot{I}_{ij}$, $|\dot{I}_{ik}|$ is a magnitude of $\dot{I}_{ik}$, and k≠j; and determine, based on $\dot{I}_{ij}$, $\dot{U}_{1i}$, and the ratio of $|\dot{I}_{ik}|$ to $|\dot{I}_{ij}|$, capacitance of a first filter capacitor connected to the $j^{th}$ output terminal.

The signal generator 1003 is configured to output the first voltage $\dot{U}_{1i}$ through the $i^{th}$ output terminal under the control of the processor 1002, where the voltage output by the output terminal other than the $i^{th}$ output terminal is zero.

Optionally, after determining the capacitance of the first filter capacitor connected to the $j^{th}$ output terminal, the processor 1002 is further configured to:

determine, based on the capacitance of the first filter capacitor connected to the $j^{th}$ output terminal and the ratio of $|\dot{I}_{ij}|$ to $|\dot{I}_{ik}|$, capacitance of a first filter capacitor connected to an output terminal other than the $j^{th}$ output terminal.

Optionally, the capacitance of the first filter capacitor connected to the output terminal other than the $j^{th}$ output terminal meets the following formula:

$$C_1 = \frac{C_{1j}}{l},$$

where $C_1$ is capacitance of any first filter capacitor connected to the output terminal other than the $j^{th}$ output terminal, $C_{1j}$ is the capacitance of the first filter capacitor connected to the $j^{th}$ output terminal, and l is a ratio of $|\dot{I}_{ij}|$ to a current amplitude of an inductor connected to the any first filter capacitor.

In an implementation, when N=3, the capacitance of the first filter capacitor connected to the $j^{th}$ output terminal meets the following formula:

$$C_{1j} = \frac{|\dot{I}_{ij}|(l_1 + l_2 + l_1 l_2)}{|\dot{U}_{1i}|l_1} \cdot \frac{1}{2\pi f_1},$$

where $C_{1j}$ is the capacitance of the first filter capacitor connected to the $j^{th}$ output terminal, $l_1$ is a ratio of $|\dot{I}_{ij}|$ to $|\dot{I}_{i(6-i-j)}|$, $\dot{I}_{i(6-i-j)}$ is a current of an inductor connected to a $(6-i-j)^{th}$ output terminal when the $i^{th}$ output terminal of the inverter outputs a first voltage $U_{1i}$, $|\dot{I}_{i(6-i-j)}|$ is a magnitude of $\dot{I}_{i(6-i-j)}$, $l_2$ is a ratio of $|\dot{I}_{(6-i-j)j}|$ to $|\dot{I}_{(6-i-j)i}|$, $\dot{I}_{(6-i-j)j}$ is a current of the inductor connected to the $j^{th}$ output terminal when the $(6-i-j)^{th}$ output terminal of the inverter outputs a first voltage $\dot{U}_{1(6-i-j)}$, $\dot{I}_{(6-i-j)i}$ is a current of an inductor connected to the $i^{th}$ output terminal when the $(6-i-j)^{th}$ output terminal of the inverter outputs the first voltage $\dot{U}_{1(6-i-j)}$, $|\dot{U}_{1i}|$ is a magnitude of the first voltage $\dot{U}_{1i}$, and $f_1$ is a frequency of the first voltage $\dot{U}_{1i}$.

Optionally, each output terminal of the inverter is connected to one terminal of a second filter capacitor through an inductor, and the other terminals of all second filter capacitors are all connected to a midpoint of a direct current bus of the inverter.

The processor 1002 is further configured to: control the signal generator 1003 to output a second voltage through each output terminal, where amplitudes, frequencies, and phases of the second voltages output by the output terminals are the same; obtain a current of the inductor connected to each output terminal; determine, based on the current of the inductor connected to each output terminal, a current of a second filter capacitor connected to each output terminal; and determine, based on the second voltage output by each output terminal and the current of the second filter capacitor connected to each output terminal, capacitance of the second filter capacitor connected to each output terminal.

The signal generator 1003 is further configured to output the second voltage through each output terminal under the control of the processor 1002.

Optionally, the determined capacitance of the second filter capacitor connected to each output terminal meets the following formula:

$$C_{2n} = \frac{|\dot{I}_{C_{2n}}|}{2\pi f_2 |\dot{U}_2|},$$

where $C_{2n}$ is capacitance of a second filter capacitor connected to an $n^{th}$ output terminal of the inverter, $|\dot{I}_{C_{2n}}|$ is a magnitude of a current $\dot{I}_{C_{2n}}$ of the second filter capacitor connected to the $n^{th}$ output terminal, $f_2$ is a frequency of a second voltage $\dot{U}_2$ output by the $n^{th}$ output terminal, $|\dot{U}_2|$ is a magnitude of the second voltage $\dot{U}_2$, and $1 \leq n \leq N$, where n is a positive integer.

This embodiment of this application provides the inverter. The inverter can detect capacitance of a first filter capacitor of the inverter by outputting, through the output terminal of the inverter, a voltage for detecting the first filter capacitor, and obtaining the current of the inductor connected to the output terminal of the inverter. In this way, an external device (for example, an excitation source) for detecting the first filter capacitor does not need to be added, thereby reducing detection costs for a filter capacitor of the inverter. Further, an operating status of the inverter can be monitored based on the detected capacitance of the first filter capacitor, thereby improving operating reliability of the inverter.

In another implementation, the inverter 1000 is configured to implement the method for detecting capacitance of a filter capacitor of an inverter shown in FIG. 7, and has a function of the apparatus 900 for detecting capacitance of a filter capacitor of an inverter shown in FIG. 9. Each output terminal of the inverter is connected to one terminal of a third filter capacitor through an inductor, and the other terminals of all third filter capacitors are all connected to a midpoint of a direct current bus of the inverter.

The memory 1001 is configured to store a program instruction.

The processor 1002 is configured to invoke the program instruction stored in the memory 1001 to:

control the signal generator 1003 to output a third voltage through each output terminal, where amplitudes, frequencies, and phases of the third voltages output by the output terminals are the same; obtain a current of the inductor connected to each output terminal; determine, based on the current of the inductor connected to each output terminal, a current of the third filter capacitor connected to each output terminal; and determine, based on the third voltage output by each output terminal and the current of the third filter capacitor connected to each output terminal, capacitance of the third filter capacitor connected to each output terminal.

The signal generator 1003 is further configured to output the third voltage through each output terminal under the control of the processor 1002.

Optionally, the determined capacitance of the third filter capacitor connected to each output terminal meets the following formula:

$$C_{3n} = \frac{|\dot{I}_{C_{3n}}|}{2\pi f_3 |\dot{U}_{3n}|},$$

where $C_{3n}$ an is capacitance of a third filter capacitor connected to an $n^{th}$ output terminal of the inverter, $\dot{I}_{C_{3n}}$ is a magnitude of a current of the third filter capacitor connected to the $n^{th}$ output terminal, $f_3$ is a frequency of a third voltage output by the $n^{th}$ output terminal, $\dot{U}_{3n}$ is a magnitude of the third voltage, and $1 \leq n \leq N$, where n is a positive integer.

This embodiment of this application provides the inverter. The inverter can detect the capacitance of the third filter capacitor of the inverter by outputting, through the output terminal of the inverter, a voltage for detecting the third filter capacitor, and obtaining the current of the inductor connected to the output terminal of the inverter. In this way, an external device (for example, an excitation source) for detecting the third filter capacitor does not need to be added, thereby reducing detection costs for a filter capacitor of the inverter. Further, an operating status of the inverter can be monitored based on the detected capacitance of the third filter capacitor, thereby improving operating reliability of the inverter.

In conclusion, the embodiments of this application provide a method and an apparatus for detecting capacitance of a filter capacitor of an inverter. In the method, the inverter can detect the capacitance of the filter capacitor of the inverter by outputting, through the output terminal of the inverter, a voltage for detecting the filter capacitor, and obtaining the current of the inductor connected to the output terminal of the inverter. In this way, an external device (for example, an excitation source) for detecting the filter capacitor does not need to be added, thereby reducing detection costs for the filter capacitor of the inverter. Further, an operating status of the inverter can be monitored based on the detected capacitance of the filter capacitor, thereby improving operating reliability of the inverter.

This application is described with reference to the flowcharts and/or block diagrams of the method, the device (system), and the computer program product according to the embodiments of this application. It is understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may be stored in a computer readable memory that can instruct the computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may be loaded onto a computer or another programmable data processing device, so that a series of operations and operations are performed on the computer or another programmable device, thereby generating computer-implemented processing. Therefore, the instructions executed on the computer or another programmable device provide operations for implementing a specific function in one or more processes in the flowcharts and/or in one or more blocks in the block diagrams.

Obviously, a person skilled in the art can make various modifications and variations to the embodiments of this application without departing from the spirit and scope of the embodiments of this application. This application is intended to cover these modifications and variations provided that they fall within the scope of protection defined by the following claims and their equivalent technologies.

What is claimed is:

1. A method for detecting capacitance of a filter capacitor of an inverter, wherein the method comprises:
    controlling, by the inverter, an $i^{th}$ output terminal of a plurality of output terminals of the inverter to output a first voltage $\dot{U}_{1i}$, wherein each output terminal of the inverter is connected to one terminal of a first filter capacitor of a plurality of first filter capacitors through an inductor, and wherein the other terminals of the plurality of first filter capacitors are interconnected;
    controlling, by the inverter, each output terminal other than the $i^{th}$ output terminal of the inverter to output a voltage of zero, wherein i=1, 2 ... N, i≠j, 1≤j≤N, i and j are positive integers, and N is a total quantity of output terminals of the inverter;
    obtaining, by the inverter, $\dot{I}_{ik}$, wherein $\dot{I}_{ik}$ is a current of an inductor connected to a $k^{th}$ output terminal of the inverter, when the $i^{th}$ output terminal outputs the first voltage $\dot{U}_{1i}$, k=1, 2 ... N, and k is a positive integer;
    determining, by the inverter, a ratio of $|\dot{I}_{ij}|$ to $|\dot{I}_{ik}|$, wherein $\dot{I}_{ij}$ is a current of an inductor connected to a $j^{th}$ output terminal of the inverter when the $i^{th}$ output terminal of the inverter outputs the first voltage $\dot{U}_{1i}$, $|\dot{I}_{ij}|$ is a magnitude of $\dot{I}_{ij}$, $|\dot{I}_{ik}|$ is a magnitude of $\dot{I}_{ik}$, and k≠j; and
    determining, by the inverter based on $\dot{I}_{ij}$, $\dot{U}_{1i}$, and the ratio of $|\dot{I}_{ij}|$ to $|\dot{I}_{ik}|$, capacitance of a first filter capacitor connected to the $j^{th}$ output terminal of the inverter.

2. The method according to claim 1, wherein after the determining, by the inverter, capacitance of the first filter capacitor connected to the $j^{th}$ output terminal, the method further comprises:
    determining, by the inverter based on the capacitance of the first filter capacitor connected to the $j^{th}$ output terminal and the ratio of $|\dot{I}_{ij}|$ to $|\dot{I}_{ik}|$, capacitance of a first filter capacitor connected to an output terminal other than the $j^{th}$ output terminal.

3. The method according to claim 1, wherein the capacitance of the first filter capacitor connected to the output terminal other than the jth output terminal meets the following formula:

$$C_1 = \frac{C_{1j}}{l},$$

wherein
    $C_1$ is a capacitance of any first filter capacitor connected to an output terminal other than the $j^{th}$ output terminal, $C_{1j}$ is the capacitance of the first filter capacitor connected to the $j^{th}$ output terminal, and l is a ratio of $|\dot{I}_{ij}|$ to a current amplitude of an inductor connected to any of the plurality of first filter capacitors.

4. The method according to claim 1, wherein when N=3, the capacitance of the first filter capacitor connected to the $j^{th}$ output terminal meets the following formula:

$$C_{1j} = \frac{|\dot{I}_{ij}|(l_1 + l_2 + l_1 l_2)}{|\dot{U}_{1i}|l_1} \cdot \frac{1}{2\pi f_1},$$

wherein
  $C_{1j}$ is the capacitance of the first filter capacitor connected to the $j^{th}$ output terminal, $l_1$ is a ratio of $|\dot{I}_{ij}|$ to $|\dot{I}_{i(6-i-j)}|$, wherein $|\dot{I}_{i(6-i-j)}|$ is a magnitude of $\dot{I}_{i(6-i-j)}$, $\dot{I}_{i(6-i-j)}$ is a current of an inductor connected to a $(6-i-j)^{th}$ output terminal when the $i^{th}$ output terminal of the inverter outputs the first voltage $\dot{U}_{1i}$, $l_2$ is a ratio of $|\dot{I}_{(6-i-j)i}|$ to $|\dot{I}_{(6-i-j)j}|$, $\dot{I}_{(6-i-j)j}$ is a current of the inductor connected to the $j^{th}$ output terminal when the $(6-i-j)^{th}$ output terminal of the inverter outputs the first voltage $\dot{U}_{1(6-i-j)}$, $I_{(6-i-j)i}$ is a current of an inductor connected to the $i^{th}$ output terminal when the $(6-i-j)^{th}$ output terminal of the inverter outputs the first voltage $\dot{U}_{1(6-i-j)}$, $|\dot{U}_{1i}|$ is a magnitude of the first voltage $\dot{U}_{1i}$, and $f_1$ is a frequency of the first voltage $\dot{U}_{1i}$.

5. The method according to claim 1, wherein each output terminal of the inverter is connected to one terminal of a second filter capacitor of a plurality of second filter capacitors through the inductor, and the other terminals of the plurality of second filter capacitors are connected to a midpoint of a direct current bus of the inverter.

6. The method according to claim 5, the method further comprises:
  outputting, by the inverter, a second voltage through each output terminal of the inverter, wherein the second voltage output by each of the output terminals of the inverter has a same amplitude, a same frequency, and a same phase;
  obtaining, by the inverter, an additional current of the inductor connected to each output terminal of the inverter.

7. The method according to claim 6, after obtaining, by the inverter, of the current of the inductor connected to each output terminal of the inverter, the method further comprises:
  determining, by the inverter based on the additional current of the inductor connected to each output terminal of the inverter, a current of the second filter capacitor connected to each output terminal of the inverter; and
  determining, by the inverter based on the second voltage output by each output terminal of the inverter and the current of the second filter capacitor connected to each output terminal of the inverter, a capacitance of the second filter capacitor connected to each output terminal of the inverter.

8. The method according to claim 7, wherein the determined capacitance of the second filter capacitor connected to each output terminal of the inverter meets the following formula:

$$C_{2n} = \frac{|\dot{I}_{C_{2n}}|}{2\pi f_2 |\dot{U}_2|},$$

wherein
  $C_{2n}$ is capacitance of thea second filter capacitor connected to an $n^{th}$ output terminal of the inverter, $|\dot{I}_{C_{2n}}|$ is a magnitude of a current $\dot{I}_{C_{2n}}$ of the second filter capacitor connected to the $n^{th}$ output terminal, $f_2$ is a frequency of a second voltage $\dot{U}_2$ output by the $n^{th}$ output terminal, $|\dot{U}_2|$ is a magnitude of the second voltage $\dot{U}_2$, and $1 \leq n \leq N$, wherein n is a positive integer.

9. An apparatus for detecting capacitance of a filter capacitor of an inverter, wherein the apparatus comprises:
  a processor;
  a memory coupled to the processor, and storing program instructions, which when executed by the processor, cause the processor to perform operations comprising:
  controlling an $i^{th}$ output terminal of a plurality of output terminals of the inverter to output a first voltage $\dot{U}_{1i}$, wherein each output terminal of the inverter is connected to one terminal of a first filter capacitor of a plurality of first filter capacitors through an inductor, and wherein the other terminals of the plurality of first filter capacitors are interconnected;
  controlling each output terminal other than the $i^{th}$ output terminal of the inverter to output a voltage of zero, wherein i=1, 2 . . . N, i≠j, 1≤j≤N, i and j are positive integers, and N is a total quantity of output terminals of the inverter;
  obtaining $\dot{I}_{ik}$, wherein $\dot{I}_{ik}$ is a current of an inductor connected to a $k^{th}$ output terminal of the inverter when the $i^{th}$ output terminal outputs the first voltage $\dot{U}_{1i}$, k=1, 2 . . . N, and k is a positive integer;
  determining a ratio of $|\dot{I}_{ij}|$ to $|\dot{I}_{ik}|$, wherein $\dot{I}_{ij}$ is a current of an inductor connected to a $j^{th}$ output terminal of the inverter when the $i^{th}$ output terminal of the inverter outputs the first voltage $\dot{U}_{1i}$, $|\dot{I}_{ij}|$ is a magnitude of $\dot{I}_{ij}$, $|\dot{I}_{ik}|$ is a magnitude of $\dot{I}_{ik}$, and k≠j; and
  determining, based on $\dot{I}_{ij}$, $\dot{U}_{1i}$, and the ratio of $|\dot{I}_{ij}|$ to $|\dot{I}_{ik}|$, capacitance of a first filter capacitor connected to the $j^{th}$ output terminal of the inverter.

10. The apparatus according to claim 9, wherein after determining the capacitance of the first filter capacitor connected to the $j^{th}$ output terminal, the operations further comprises:
  determining, based on the capacitance of the first filter capacitor connected to the $j^{th}$ output terminal and the ratio of $|\dot{I}_{ij}|$ to $|\dot{I}_{ik}|$, a capacitance of a first filter capacitor connected to an output terminal other than the $j^{th}$ output terminal.

11. The apparatus according to claim 9, wherein the capacitance of the first filter capacitor connected to the output terminal other than the $j^{th}$ output terminal meets the following formula:

$$C_1 = \frac{C_{1j}}{l},$$

wherein
  $C_1$ is a capacitance of any first filter capacitor connected to an output terminal other than the $j^{th}$ output terminal, $C_{1j}$ is the capacitance of the first filter capacitor connected to the $j^{th}$ output terminal, and l is a ratio of $|\dot{I}_{ij}|$ to a current amplitude of an inductor connected to any of the plurality of first filter capacitors.

12. The apparatus according to claim 9, wherein when N=3, the capacitance of the first filter capacitor connected to the $j^{th}$ output terminal meets the following formula:

$$C_{1j} = \frac{|\dot{I}_{ij}|(l_1 + l_2 + l_1 l_2)}{|\dot{U}_{1i}|l_1} \cdot \frac{1}{2\pi f_1},$$

wherein
  $C_{1j}$ is the capacitance of the first filter capacitor connected to the $j^{th}$ output terminal, $l_1$ is a ratio of $|\dot{I}_{ij}|$ to $|\dot{I}_{i(6-i-j)}|$, $\dot{I}_{i(6-i-j)}$ is a current of an inductor connected to a $(6-i-j)^{th}$ output terminal when the $i^{th}$ output terminal of the inverter outputs the first voltage $\dot{U}_{1i}$, $|\dot{I}_{i(6-i-j)}|$ is a magnitude of $\dot{I}_{i(6-i-j)}$, $l_2$ is a ratio of $|\dot{I}_{(6-i-j)j}|$ to $|\dot{I}_{(6-i-j)i}|$, $\dot{I}_{(6-i-j)j}$ is a current of the inductor connected to the $j^{th}$ output terminal when the $(6-i-j)^{th}$ output terminal of the inverter outputs the first voltage $\dot{U}_{1(6-i-j)}$, $I_{(6-i-j)i}$ is a current of an inductor connected to the $i^{th}$ output terminal when the $(6-i-j)^{th}$ output terminal of the inverter outputs the first voltage $\dot{U}_{1(6-i-j)}$, $|\dot{U}_{1i}|$ is a magnitude of the first voltage $|\dot{U}_{1i}|$ and $f_1$ is a frequency of the first voltage $\dot{U}_{1i}$.

13. The apparatus according to claim 9, wherein each output terminal of the inverter is connected to one terminal of a second filter capacitor of a plurality of second filter capacitors through the inductor, and the other terminals of the plurality of second filter capacitors are connected to a midpoint of a direct current bus of the inverter.

14. The apparatus according to claim 13, wherein the operations further comprises:
    outputting a second voltage through each output terminal of the inverter, wherein the second voltage output by each of the plurality of output terminals of the inverter has a same amplitude, a same frequency, and a same phase;
    obtaining an additional current of the inductor connected to each output terminal of the inverter;
    determining, based on the additional current of the inductor connected to each output terminal of the inverter, a current of the second filter capacitor connected to each output terminal of the inverter; and
    determining, based on the second voltage output by each output terminal of the inverter and the current of the second filter capacitor connected to each output terminal of the inverter, a capacitance of the second filter capacitor connected to each output terminal of the inverter.

15. The apparatus according to claim 14, wherein the determined capacitance of the second filter capacitor connected to each output terminal meets the following formula:

$$C_{2n} = \frac{|\dot{I}_{C_{2n}}|}{2\pi f_2 |\dot{U}_2|},$$

wherein
$C_{2n}$ is capacitance of a second filter capacitor connected to an $n^{th}$ output terminal of the inverter, $|\dot{I}_{C_{2n}}|$ is a magnitude of a current $\dot{I}_{C_{2n}}$ of the second filter capacitor connected to the $n^{th}$ output terminal, $f_2$ is a frequency of a second voltage $\dot{U}_2$ output by the $n^{th}$ output terminal, $|\dot{U}_2|$ is a magnitude of the second voltage $\dot{U}_2$, and $1 \leq n \leq N$, wherein n is a positive integer.

16. A non-transitory machine-readable medium having instructions stored therein, which when executed by a processor, cause the processor to perform operations, the operations comprising:
    controlling, by an inverter, an $i^{th}$ output terminal of a plurality of output terminals of the inverter to output a first voltage $\dot{U}_{1i}$, wherein each output terminal of the inverter is connected to one terminal of a first filter capacitor of a plurality of first filter capacitors through an inductor, and wherein the other terminals of the plurality of first filter capacitors are interconnected;
    controlling, by the inverter, each output terminal other than the $i^{th}$ output terminal of the inverter to output a voltage of zero, wherein i=1, 2 ... N, i≠j, 1≤j≤N, i and j are positive integers, and N is a total quantity of output terminals of the inverter;
    obtaining, by the inverter, $\dot{I}_{ik}$, wherein $\dot{I}_{ik}$ is a current of an inductor connected to a $k^{th}$ output terminal of the inverter, when the $i^{th}$ output terminal outputs the first voltage $\dot{U}_{1i}$, k=1, 2 ... N, and k is a positive integer;
    determining, by the inverter, a ratio of $|\dot{I}_{ij}|$ to $|\dot{I}_{ik}|$, wherein $\dot{I}_{ij}$ is a current of an inductor connected to a $j^{th}$ output terminal of the inverter when the $i^{th}$ output terminal of the inverter outputs the first voltage $\dot{U}_{1i}$, $|\dot{I}_{ij}|$ a magnitude of $\dot{I}_{ij}$, $|\dot{I}_{ik}|$ is a magnitude of $\dot{I}_{ik}$, and k≠j; and
    determining, by the inverter based on $\dot{I}_{ij}$, $\dot{U}_{1i}$, and the ratio of $|\dot{I}_{ij}|$ to $|\dot{I}_{ik}|$, capacitance of a first filter capacitor connected to the $j^{th}$ output terminal.

17. The non-transitory machine-readable medium according to claim 16, wherein after the determining, by the inverter, capacitance of the first filter capacitor connected to the $j^{th}$ output terminal, the operations further comprise:
    determining, by the inverter based on the capacitance of the first filter capacitor connected to the $j^{th}$ output terminal and the ratio of $|\dot{I}_{ij}|$ to $|\dot{I}_{ik}|$, capacitance of a first filter capacitor connected to an output terminal other than the $j^{th}$ output terminal.

18. T The non-transitory machine-readable medium according to claim 16, wherein the capacitance of the first filter capacitor connected to the output terminal other than the jth output terminal meets the following formula:

$$C_1 = \frac{C_{1j}}{l},$$

wherein
$C_1$ is a capacitance of any first filter capacitor connected to an output terminal other than the $j^{th}$ output terminal, $C_{1j}$ is the capacitance of the first filter capacitor connected to the $j^{th}$ output terminal, and l is a ratio of $|\dot{I}_{ij}|$ to a current amplitude of an inductor connected to any of the plurality of first filter capacitors.

19. The non-transitory machine-readable medium according to claim 16, wherein when N=3, the capacitance of the first filter capacitor connected to the $j^{th}$ output terminal meets the following formula:

$$C_{1j} = \frac{|\dot{I}_{ij}|(l_1 + l_2 + l_1 l_2)}{|\dot{U}_{1i}|l_1} \cdot \frac{1}{2\pi f_1},$$

wherein
$C_{1j}$ is the capacitance of the first filter capacitor connected to the $j^{th}$ output terminal, $l_1$ is a ratio of $|\dot{I}_{ij}|$ to $|\dot{I}_{i(6-i-j)}|$, wherein $|\dot{I}_{i(6-i-j)}|$ is a magnitude of $\dot{I}_{i(6-i-j)}$, $\dot{I}_{(6-i-j)}$ is a current of an inductor connected to a $(6-i-j)^{th}$ output terminal when the $i^{th}$ output terminal of the inverter outputs the first voltage $\dot{U}_{1i}$, $l_2$ is a ratio of $|\dot{I}_{(6-i-j)j}|$ to $|\dot{I}_{(6-i-j)i}|$, $\dot{I}_{(6-i-j)j}$ is a current of the inductor connected to the $j^{th}$ output terminal when the $(6-i-j)^{th}$ output terminal of the inverter outputs the first voltage $\dot{U}_{1(6-i-j)}$, $\dot{I}_{(6-i-j)i}$ is a current of an inductor connected to the $i^{th}$ output terminal when the $(6-i-j)^{th}$ output terminal of the inverter outputs the first voltage $\dot{U}_{1(6-i-j)}$, $\dot{U}_{1i}$ is a magnitude of the first voltage $\dot{U}_{1i}$, and $f_1$ is a frequency of the first voltage $\dot{U}_{1i}$.

20. The non-transitory machine-readable medium according to claim 16, wherein each output terminal of the inverter is connected to one terminal of a second filter capacitor of a plurality of second filter capacitors through the inductor, and the other terminals of the plurality of second filter capacitors are connected to a midpoint of a direct current bus of the inverter.

* * * * *